United States Patent
Iida et al.

(10) Patent No.: US 10,806,033 B2
(45) Date of Patent: Oct. 13, 2020

(54) INTERPOSER AND ELECTRONIC DEVICE

(71) Applicant: Murata Manufacturing Co., Ltd., Nagaokakyo-shi, Kyoto-fu (JP)

(72) Inventors: Kanto Iida, Nagaokakyo (JP); Shinichi Araki, Nagaokakyo (JP); Ryosuke Takada, Nagaokakyo (JP); Takahiro Baba, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/807,307

(22) Filed: Mar. 3, 2020

(65) Prior Publication Data
US 2020/0205289 A1    Jun. 25, 2020

Related U.S. Application Data

(63) Continuation of application No. PCT/JP2018/033546, filed on Sep. 11, 2018.

(30) Foreign Application Priority Data

Oct. 3, 2017   (JP) .................................. 2017-193155

(51) Int. Cl.
*H05K 1/14* (2006.01)
*H05K 1/02* (2006.01)
*H05K 3/36* (2006.01)

(52) U.S. Cl.
CPC ............. *H05K 1/147* (2013.01); *H05K 1/028* (2013.01); *H05K 1/144* (2013.01); *H05K 3/363* (2013.01); *H05K 2201/09445* (2013.01)

(58) Field of Classification Search
CPC .................. H05K 1/028; H05K 1/14–147
See application file for complete search history.

(56) References Cited

U.S. PATENT DOCUMENTS

| | | | |
|---|---|---|---|
| 2005/0077546 A1* | 4/2005 | Neaves | ................... H01L 23/48 257/210 |
| 2012/0262862 A1* | 10/2012 | Johnson | ............... H05K 1/0237 361/679.02 |

(Continued)

FOREIGN PATENT DOCUMENTS

| JP | 08-130351 A | 5/1996 |
|---|---|---|
| JP | 2010-258301 A | 11/2010 |

(Continued)

OTHER PUBLICATIONS

Official Communication issued in International Patent Application No. PCT/JP2018/033546, dated Dec. 4, 2018.

*Primary Examiner* — Hoa C Nguyen
(74) *Attorney, Agent, or Firm* — Keating & Bennett, LLP

(57) ABSTRACT

An interposer includes a stacked body including first and second mounting surfaces that face each other, a first electrode on the first mounting surface, and a second electrode on the second mounting surface. The stacked body includes flexible insulating layers stacked on each other, and a folded portion. The first and second electrodes are electrically connected to each other. The stacked body includes an upright portion between the first and second mounting surfaces and in which a stacking direction in which the insulating layers are stacked is parallel to the first and second mounting surfaces, and a bent portion bent in a plan view of the first and second mounting surfaces.

22 Claims, 21 Drawing Sheets

(56) References Cited

U.S. PATENT DOCUMENTS

2014/0234058 A1    8/2014  Murata et al.
2016/0174304 A1*   6/2016  Kim .................... H01L 51/0097
                                                         313/511

FOREIGN PATENT DOCUMENTS

| JP | 2011-111195 A | 6/2011 |
| JP | 2013-062473 A | 4/2013 |
| JP | 2014-160776 A | 9/2014 |
| WO | 2004/080136 A1 | 9/2004 |

* cited by examiner (1)

(2)

(3)

INTERPOSER AND ELECTRONIC DEVICE

CROSS REFERENCE TO RELATED APPLICATIONS

This application claims the benefit of priority to Japanese Patent Application No. 2017-193155 filed on Oct. 3, 2017 and is a Continuation Application of PCT Application No. PCT/JP2018/033546 filed on Sep. 11, 2018. The entire contents of each application are hereby incorporated herein by reference.

BACKGROUND OF THE INVENTION

1. Field of the Invention

The present invention relates to an interposer that connects a plurality of circuit boards or the like, the plurality of circuit boards each including a predetermined circuit, and to an electronic device including such an interposer.

2. Description of the Related Art

With high integration of a circuit board and an electronic component provided in an electronic device, and also with a mixture of circuit boards that have different wiring densities, a structure in which a plurality of circuit boards are electrically connected through an interposer as necessary may be used.

For example, Japanese Unexamined Patent Application Publication No. 2010-258301 discloses a structure in which a first element (a first circuit board) and a second element (a second circuit board) are electrically connected to each other, with an interposer interposed therebetween.

However, in the structure disclosed in Japanese Unexamined Patent Application Publication No. 2010-258301, the following problems make it difficult to obtain an interposer of any shape (outer shape).

The interposer is obtained by dividing a mother substrate having a plurality of insulating layers stacked on each other, and, in a case in which the interposer to be divided has a portion with a narrow width (a width in a direction perpendicular or substantially perpendicular to a stacking direction of the plurality of insulating layers), the portion breaks easily when the mother substrate is divided, which makes it difficult to divide an interposer.

Further, it is difficult to process (cut, for example) a mother substrate having a large thickness (thickness in the stacking direction of the plurality of insulating layers) and it is also difficult to configure a thick interposer into a desired shape. In particular, it is difficult to accurately cut out a shape with a high aspect ratio from the mother substrate.

SUMMARY OF THE INVENTION

Preferred embodiments of the present invention provide interposers that are each capable of easily having any shape, and also provide electronic devices each including such an interposer.

An interposer according to a preferred embodiment of the present invention includes a stacked body including a first mounting surface and a second mounting surface that face each other, a plurality of insulating layers having flexibility and being stacked on each other, and a folded portion; a first electrode provided on the first mounting surface; and a second electrode provided on the second mounting surface and being electrically connected to the first electrode, and the stacked body includes an upright portion disposed between the first mounting surface and the second mounting surface and being a portion in which a stacking direction in which the plurality of insulating layers are stacked is parallel or substantially parallel to the first mounting surface and the second mounting surface, and a bent portion bent in a plan view of the first mounting surface and the second mounting surface.

With this configuration, since an interposer has a desired shape by folding a stacked body, as compared with a case of dividing (cutting, for example) a mother substrate and providing a desired shape, an interposer of any shape is able to be easily provided.

In an interposer according to a preferred embodiment of the present invention, the stacked body may preferably include a cutout portion in a portion (the folded portion) that is folded. According to this configuration, the stacked body is easily folded, which makes it possible to easily provide an interposer having a desired shape. In addition, with this configuration, the bend radius of the folded portion is able to be reduced.

In an interposer according to a preferred embodiment of the present invention, the stacked body may preferably include a concave portion in the portion that is folded, the concave portion including the smaller number of stacked insulating layers than other portions. According to this configuration, the stacked body is easily folded, which makes it possible to easily provide an interposer having a desired shape. In addition, with this configuration, the bend radius of the folded portion is able to be reduced.

In an interposer according to a preferred embodiment of the present invention, the stacked body may preferably include a first connection portion including the first mounting surface, and the first electrode may preferably be a conductor pattern provided on the first mounting surface of the first connection portion and provided on a surface of the plurality of insulating layers.

In an interposer according to a preferred embodiment of the present invention, the stacked body may preferably include a second connection portion including the second mounting surface, and the second electrode may preferably be a conductor pattern provided on the second mounting surface of the second connection portion and provided on a surface of the plurality of insulating layers.

In an interposer according to a preferred embodiment of the present invention, two or more insulating layers that are adjacent to each other among the plurality of insulating layers may preferably be made of a thermoplastic resin. According to this configuration, since the stacked body is able to be easily provided by collectively pressing the stacked insulating layers, the number of steps of manufacturing the stacked body and the cost are able to be reduced. In addition, with this configuration, an interposer capable of being easily plastically deformed and maintaining (holding) a desired shape is able to be achieved.

An electronic device according to a preferred embodiment of the present invention includes a first element, a second element, and an interposer that electrically connects the first element and the second element, and the interposer includes a stacked body including a first mounting surface and a second mounting surface that face each other, a plurality of insulating layers having flexibility and being stacked on each other, and a folded portion; a first electrode provided on the first mounting surface; and a second electrode provided on the second mounting surface and being electrically connected to the first electrode, and the stacked body includes an upright portion disposed between the first mounting surface and the second mounting surface and being a portion in which a stacking direction in which the plurality of insulating layers are stacked is parallel or substantially parallel to the first mounting surface and the second mounting surface, and a bent portion bent in a plan view of the first mounting surface and the second mounting surface, and the first electrode is electrically connected to the first element, and the second electrode is electrically connected to the second element.

With this configuration, an electronic device including an interposer capable of easily having any shape is able to be achieved.

According to preferred embodiments of the present invention, interposers that are each capable of easily having any shape and electronic devices each including such an interposer are able to be obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
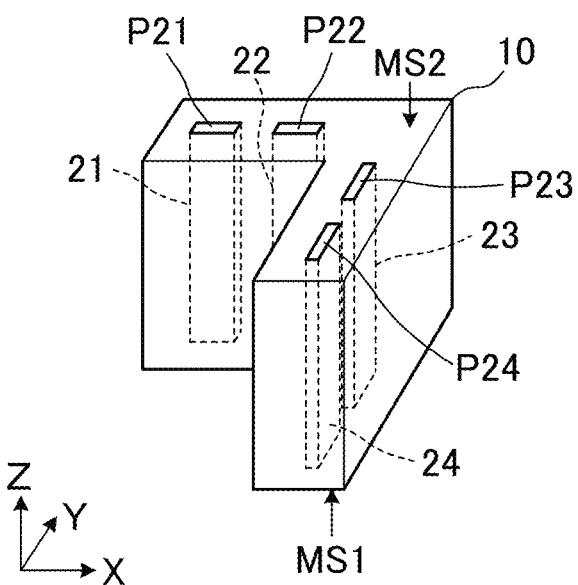
FIG. 1A is an external perspective view of an interposer 301 according to a first preferred embodiment of the present invention.

Hereinafter, a plurality of preferred embodiments of the present invention will be described in detail with reference to the attached drawings and several specific examples. In the drawings, components and elements assigned with the same reference numerals or symbols will represent the same or corresponding components and elements. While preferred embodiments of the present invention are divided and described for the sake of convenience in consideration of ease of description or understanding of main points, elements described in different preferred embodiments are able to be partially replaced and combined with each other. In second and subsequent preferred embodiments, a description of features common to the first preferred embodiment will be omitted, and different features will be mainly described. In particular, the same or substantially the same advantageous functions and effects by the same configurations will not be described one by one for each preferred embodiment.

First Preferred Embodiment

Figure 1B:
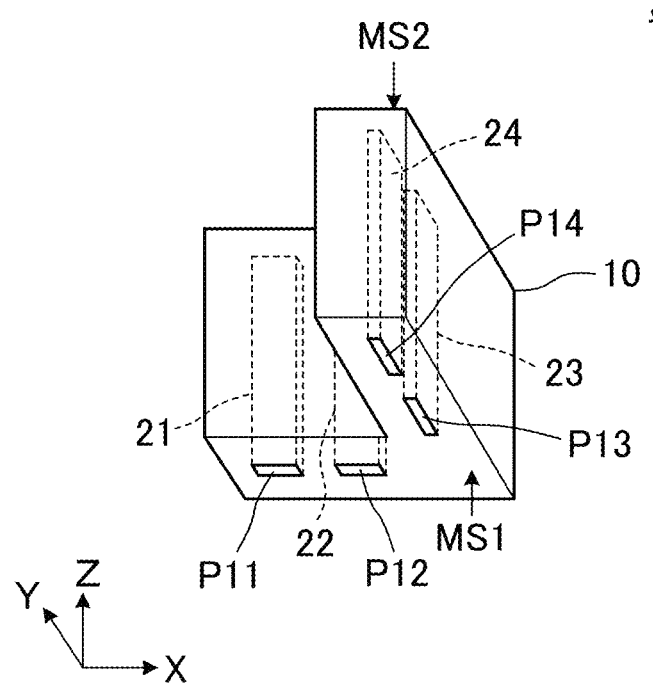
FIG. 1B is an external perspective view of the interposer 301 viewed from a different viewpoint.
Figure 2:
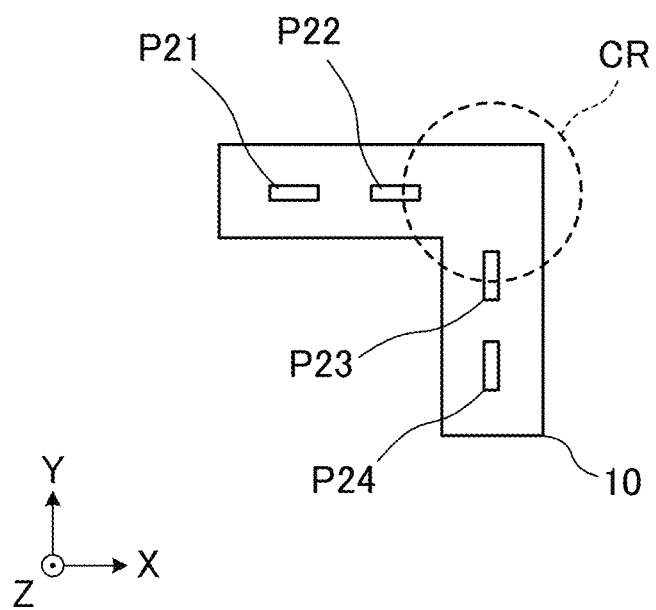
FIG. 2 is a plan view of the interposer 301.
Figure 3:
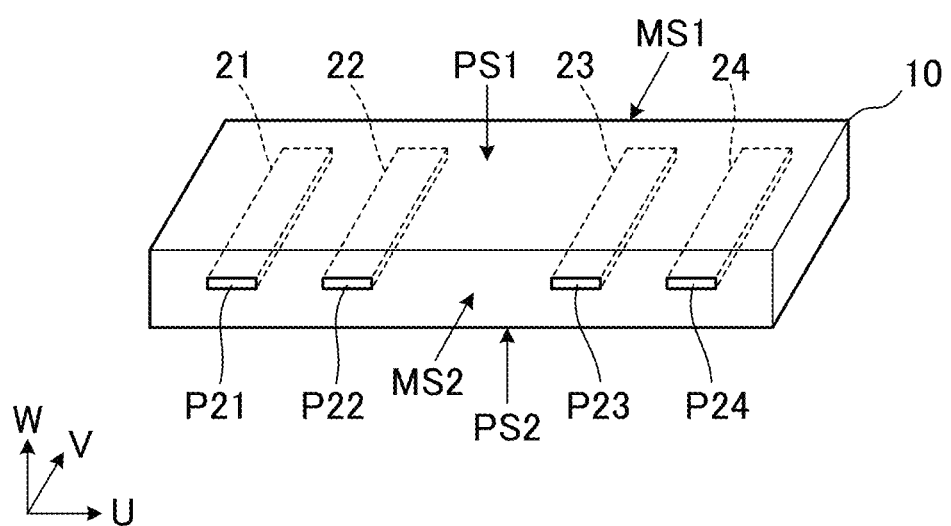
FIG. 3 is an external perspective view showing a state before the interposer 301 is folded.

FIG. 1A is an external perspective view of an interposer 301 according to a first preferred embodiment of the present invention, and FIG. 1B is an external perspective view of the interposer 301 viewed from a different viewpoint. FIG. 2 is a plan view of the interposer 301. FIG. 3 is an external perspective view showing a state before the interposer 301 is folded.

Interposers according to preferred embodiments of the present invention are each interposed between a first element and a second element, and electrically connect the first element and the second element.

The interposer 301 includes a stacked body 10 including a plurality of insulating layers (to be described in detail later) having flexibility, that are stacked on each other, a plurality of first electrodes P11, P12, P13, and P14, and a plurality of second electrodes P21, P22, P23, and P24.

The stacked body 10 is folded and includes a first mounting surface MS1 and a second mounting surface MS2 that face each other. The stacked body 10 is provided such that a plate preferably made of a thermoplastic resin such as a liquid crystal polymer (LCP), for example, is folded into an L shape.

The folded stacked body 10 is obtained, for example, by folding a vicinity of the center in a long-side direction of a rectangular or substantially rectangular parallelepiped-shaped stacked body 10 (a rectangular or substantially rectangular plate of which the long-side direction coincides with a U axis direction) shown in FIG. 3, into an L shape, by heating and pressing. As a result, the stacked body that maintains (holds) the folded shape is obtained.

The plurality of first electrodes P11, P12, P13, and P14 are provided on the first mounting surface MS1 of the stacked body 10, and the plurality of second electrodes P21, P22, P23, and P24 are provided on the second mounting surface MS2 of the stacked body 10. The plurality of first electrodes P11, P12, P13, and P14 are disposed at equal or substantially equal intervals, and the plurality of second electrodes P21, P22, P23, and P24 are disposed at equal or substantially equal intervals.

As mainly shown in FIGS. 1A and 1B, linear conductors 21, 22, 23, and 24 are provided inside (on a surface of an insulating layer) of the stacked body 10. The first electrode P11 and the second electrode P21 are end surfaces (end portions) of the conductor 21 that are respectively exposed on the first mounting surface MS1 and the second mounting surface MS2. The first electrode P12 and the second electrode P22 are end surfaces of the conductor 22 that are respectively exposed on the first mounting surface MS1 and the second mounting surface MS2. The first electrode P13 and the second electrode P23 are end surfaces of the conductor 23 that are respectively exposed on the first mounting surface MS1 and the second mounting surface MS2. The first electrode P14 and the second electrode P24 are end surfaces of the conductor 24 that are respectively exposed on the first mounting surface MS1 and the second mounting surface MS2. The conductors 21, 22, 23, and 24 are each preferably conductor patterns such as a Cu foil, for example.

In this manner, the first electrode P11 and the second electrode P21 are electrically connected to each other. The first electrode P12 and the second electrode P22 are electrically connected to each other. The first electrode P13 and the second electrode P23 are electrically connected to each other. The first electrode P14 and the second electrode P24 are electrically connected to each other.

The stacked body 10 includes an upright portion. The upright portion refers to a portion located between the first mounting surface MS1 and the second mounting surface MS2, and including the stacking direction of the plurality of insulating layers (to be described in detail later) being a direction (a direction parallel or substantially parallel to an XY plane) parallel to the first mounting surface MS1 and the second mounting surface MS2. In the first preferred embodiment, the entire or substantially the entire stacked body 10 is the upright portion.

In addition, the stacked body 10, as shown in FIG. 2, includes a bent portion CR that is bent in a plan view (viewed in a Z axis direction) of the first mounting surface MS1 and the second mounting surface MS2.

Figure 4:
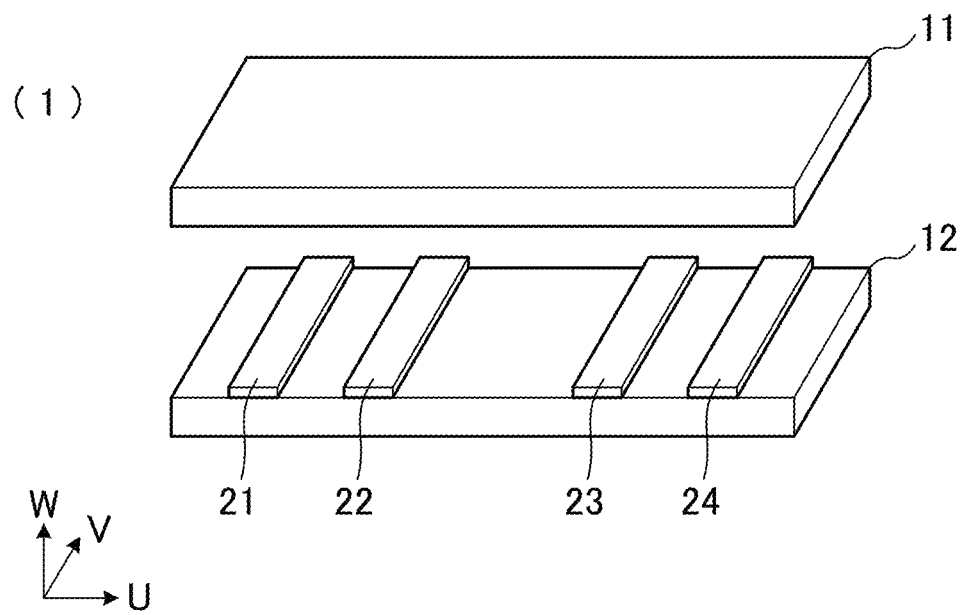
FIG. 4 is a perspective view sequentially showing steps of manufacturing the interposer 301 before being folded.
Figure 4:
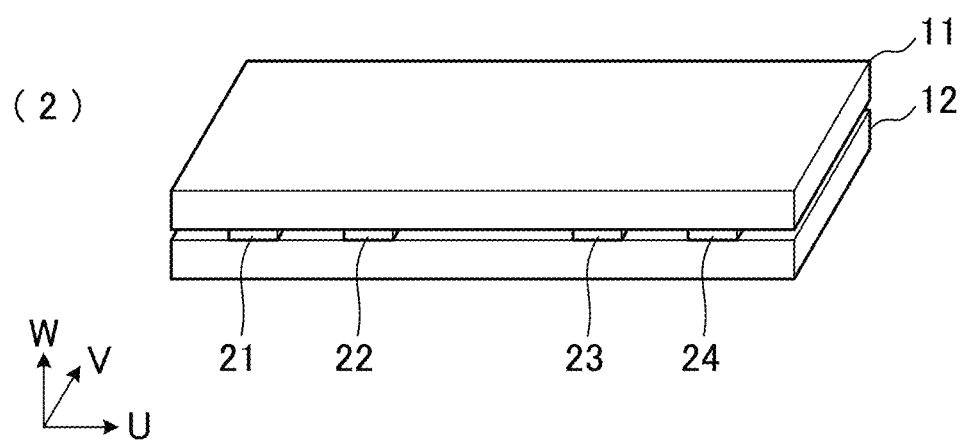
Figure 4:
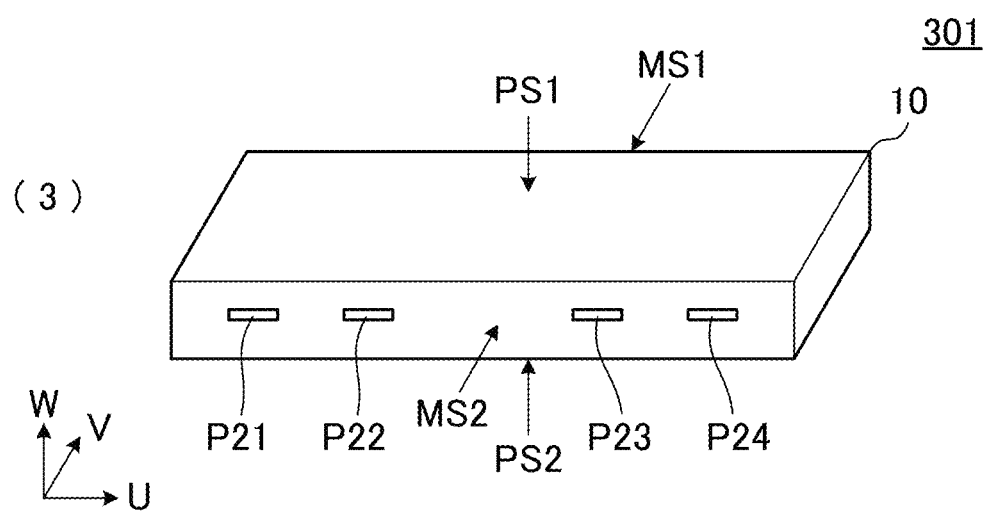

The interposer 301 according to the first preferred embodiment is preferably manufactured by, for example, the following steps. FIG. 4 is a perspective view sequentially showing steps of manufacturing the interposer 301 before being folded. It is to be noted that, in FIG. 4, for the sake of convenience of explanation, although explanation will be provided in manufacturing steps with an individual piece (one chip), the actual steps of manufacturing the interposer are performed in a collective substrate state. The same applies to each view showing subsequent manufacturing steps.

First, as shown in step (1) in FIG. 4, a plurality of insulating layers 11 and 12 having flexibility are prepared. The plurality of insulating layers 11 and 12 are rectangular or substantially rectangular resin plates having the same or substantially the same shape. The plurality of insulating layers and 12 are preferably sheets made of, for example, a thermoplastic resin such as a liquid crystal polymer (LCP), for example.

Subsequently, the linear conductors 21, 22, 23, and 24 are formed on the insulating layer 12. Specifically, a metal foil (a Cu foil, for example) is laminated on one (a front surface) of the principal surfaces of the insulating layer 12 in a collective substrate state, and the metal foil is patterned by photolithography, for example. As a result, the conductors 21, 22, 23, and 24 are provided on the surface of the insulating layer 12.

Subsequently, as shown in step (2) in FIG. 4, the plurality of insulating layers 12 and 11 are stacked in this order, and then the stacked insulating layers 11 and 12 are heated and pressed to form a stacked body.

Finally, the stacked body in a collective substrate state is divided to obtain an individual interposer 301 (a rectangular or substantially rectangular parallelepiped-shaped stacked body 10) as shown in step (3) in FIG. 4.

Figure 5A:
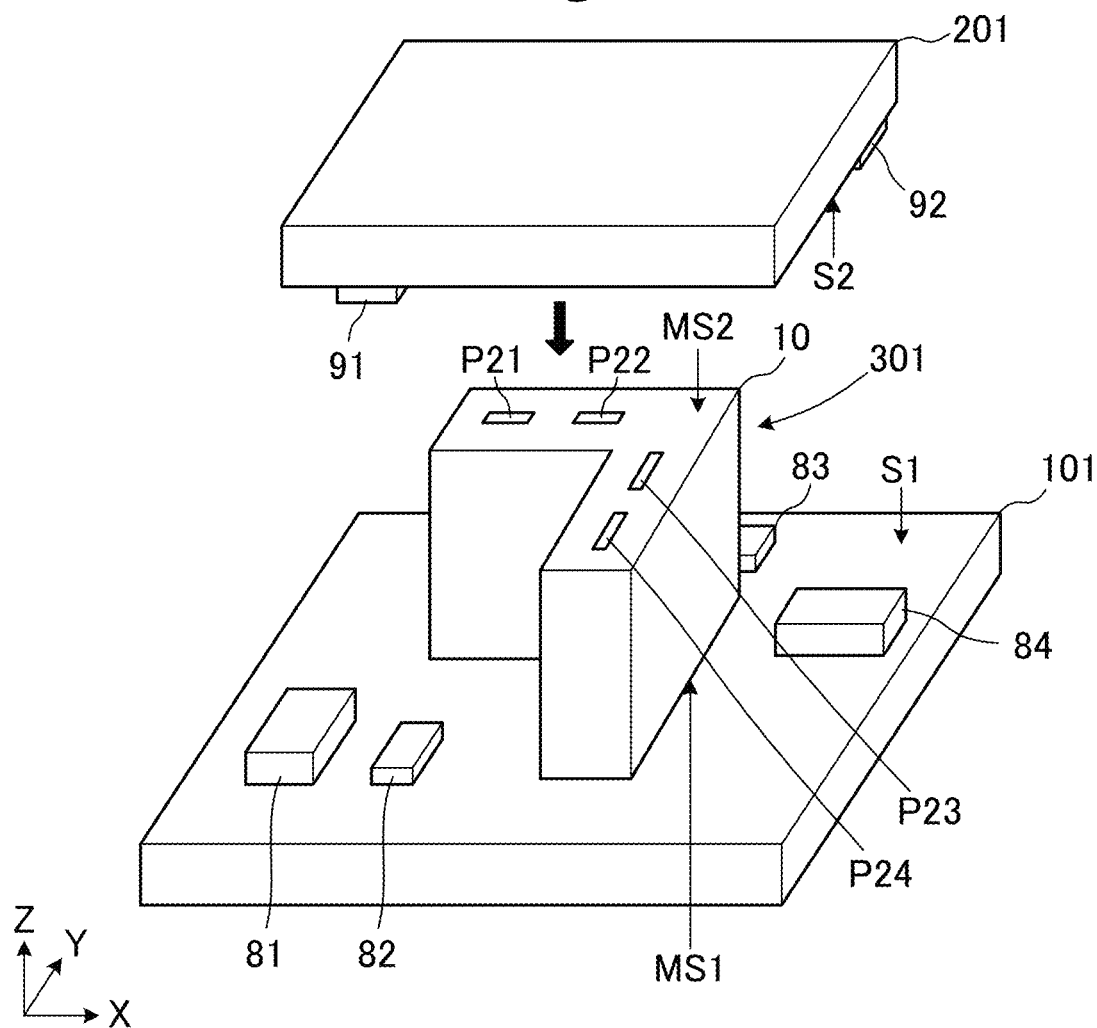
FIG. 5A is an exploded perspective view showing a main portion of an electronic device 401 according to the first preferred embodiment of the present invention.
Figure 5B:
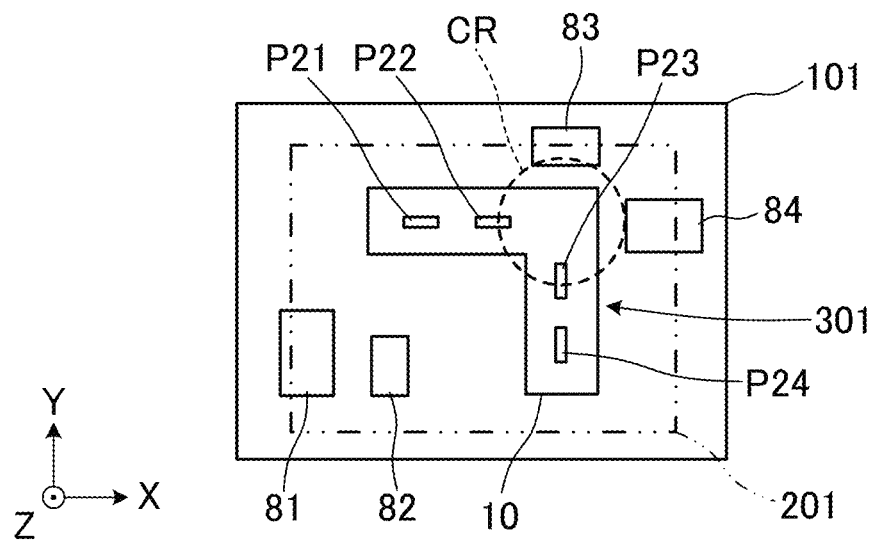
FIG. 5B is a plan view showing the main portion of the electronic device 401.

Subsequently, an electronic device including an interposer according to a preferred embodiment of the present invention will be described with reference to the drawings. FIG. 5A is an exploded perspective view showing a main portion of an electronic device 401 according to the first preferred embodiment of the present invention, and FIG. 5B is a plan view showing the main portion of the electronic device 401. In FIG. 5B, in order to make the structure more understandable, a second circuit board 201 is indicated by an alternate long and two short dashes line.

The electronic device 401 includes a first circuit board 101, a second circuit board 201, and an interposer 301. The interposer 301 is entirely or substantially entirely disposed (interposed) between the first circuit board 101 and the second circuit board 201. The first circuit board 101 and the second circuit board 201 are preferably glass epoxy substrates, for example.

In the first preferred embodiment, the first circuit board 101 is an example of the "first element", and the second circuit board 201 is an example of the "second element".

As mainly shown in FIG. 5A, the interposer 301 is mounted on an upper surface S1 of the first circuit board 101 including a plurality of components 81, 82, 83, and 84, and components 91 and 92 are mounted on a lower surface S2 of the second circuit board 201. As shown in FIG. 5A, the first mounting surface MS1 of the stacked body 10 faces the upper surface S1 of the first circuit board 101, and the second mounting surface MS2 faces the lower surface S2 of the second circuit board 201. The components 81, 82, 83, 84, 91, and 92 are, for example, chip components such as chip inductors and chip capacitors.

A plurality of first lands (not shown) are provided at positions of the upper surface S1 of the first circuit board 101 facing the first electrodes P11, P12, P13, and P14. The first electrodes P11, P12, P13, and P14 of the interposer 301 are respectively directly soldered to the plurality of first lands. Accordingly, the interposer 301 (the first electrodes P11, P12, P13, and P14) is electrically connected to the first circuit board 101.

A plurality of second lands (not shown) are provided at positions of the lower surface S2 of the second circuit board 201, facing the second electrodes P21, P22, P23, and P24. The second electrodes P21, P22, P23, and P24 of the interposer 301 are respectively directly soldered to the plurality of second lands. Accordingly, the interposer 301 (the second electrodes P21, P22, P23, and P24) is electrically connected to the second circuit board 201.

In order to obtain the state shown in FIG. 5A, for example, the interposer 301 is first attached to the lower surface S2 of the second circuit board 201, and the second circuit board 201 with the interposer 301 is mounted on the first circuit board 101. Specifically, cream solder, for example, is printed on each of the second lands of the second circuit board 201 to mount the interposer 301 as well as the component 91 (see FIG. 5A) to the second circuit board 201, and then the second circuit board 201, by being passed through a reflow furnace, is soldered together with the component 91 by a batch reflow soldering method, for example. Subsequently, the second circuit board 201 with the interposer 301 is mounted on the upper surface S1 of the first circuit board 101 by a reflow soldering method, for example. It is to be noted that a melting point of the solder to mount a component to the second circuit board 201 is higher than a melting point of solder used to surface-mounting to the first circuit board 101.

Alternatively, in order to obtain the state shown in FIG. 5A, for example, the interposer 301 may be first mounted on the upper surface S1 of the first circuit board 101, and the second circuit board 201 may be further mounted on the interposer 301.

In addition, in the first preferred embodiment, the first circuit board 101 and the second circuit board 201 are preferably, glass epoxy substrates, and have an effective relative dielectric constant of about 4, for example. On the other hand, the stacked body 10 of the interposer 301 is preferably made of a liquid crystal polymer (LCP), and has an effective relative dielectric constant of about 3, for example. In other words, in the first preferred embodiment, the effective relative dielectric constant of the stacked body 10 of the interposer 301 is smaller than the effective relative dielectric constant of the first circuit board 101 and the second circuit board 201.

In the first preferred embodiment, the effective elastic modulus of the interposer 301 is smaller than the effective elastic modulus of the first circuit board 101 and the second circuit board 201. For example, a Young's modulus of the glass epoxy substrates is preferably about 25 GPa. On the other hand, a Young's modulus of the liquid crystal polymer (LCP) of the stacked body 10 of the interposer 301 is preferably about 15 GPa, for example.

It is to be noted that, the "effective relative dielectric constant" and the "effective elastic modulus" in the present specification are not limited to a "relative dielectric constant" and an "elastic modulus" of a single material but refer to a "relative dielectric constant" and an "elastic modulus" of the entire composite material (a composite material including resin, a conductor pattern, an interlayer connection conductor, or an adhesive agent).

According to the interposer 301 of the first preferred embodiment of the present invention, the following advantageous effects are obtained.

(a) In the first preferred embodiment, the interposer 301 is interposed between the first element (the first circuit board 101) and the second element (the second circuit board 201), and the first element and the second element are electrically connected to each other through the interposer 301. According to this configuration, while a space to mount the components 81, 82, 83, 84, 91, and 92 on the surface (the upper surface S1 of the first circuit board 101) of the first element, and the surface (the lower surface S2 of the second circuit board 201) of the second element is ensured, the first circuit board 101 and the second circuit board 201 are able to be electrically connected, and spaced from each other.

(b) In the first preferred embodiment, the stacked body is folded to provide the interposer 301. Therefore, an interposer of a desired shape is able to be provided more easily by folding than by dividing (cutting, for example) a mother substrate. In addition, an electronic device including an interposer capable of being easily provided into a desired shape is able to be achieved.

(c) In the first preferred embodiment, the stacked body 10 is folded to provide a desired shape, so that, even when a portion (a portion with a high aspect ratio, in particular) difficult to be divided from a mother substrate is included, an interposer of a desired shape is able to be easily obtained.

(d) In the first preferred embodiment, as mainly shown in FIG. 5A, the thickness (a height in the Z axis direction) of the interposer mainly includes the upright portion. Therefore, a stacked body (the stacked body 10 of which the thickness in a W axis direction shown in FIG. 3 is small) that includes the smaller number of stacked insulating layers than a common interposer (the interposer including a stacked body in which a plurality of insulating layers are stacked in the thickness direction (the Z axis direction)) is able to provide an interposer having the same thickness as the common interposer. Thus, according to this configuration, a stacked body is able to be provided with a small number of manufacturing steps and a small number of materials, so that an interposer of a desired shape is able to be obtained at low cost.

(e) In the first preferred embodiment, wiring in the thickness direction (the Z axis direction) of the interposer is not provided by an interlayer connection conductor such as a through hole or a via conductor, but is provided mainly by a conductor pattern (the conductors 21 to 24). With this configuration, an interposer is able to be easily provided. It is to be noted that, in a case of the common interposer, the wiring in the thickness direction is provided by an interlayer connection conductor, which requires steps including providing a through hole in the stacked body (or each insulating layer defining the stacked body) and filling a conductive element in the through hole, and thus makes the manufacturing steps complicated. In particular, in a case in which the wiring in the thickness direction of a thick stacked body is provided by a through hole of which the inside is plated, it is necessary to provide an elongated through hole and it is difficult to provide such a through hole.

In addition, the wiring in the thickness direction (the Z axis direction) of the interposer is provided mainly by a conductor pattern, which makes it easy to adjust the line width of the wiring, so that conductor loss is able to be easily reduced by increasing the line width of the wiring. Further, the wiring in the thickness direction of the interposer is provided mainly by a conductor pattern, which makes it possible to improve the reliability of electrical connection, as compared with the common interposer. It is to be noted that, in a case in which the wiring in the thickness direction of the stacked body with the large number of insulating layers is provided by a via conductor (an interlayer connection conductor provided by filling conductive paste), the number of via conductors is increased and the conductor loss is increased. In addition, as the number of connecting portions by via conductors is increased, the reliability of electrical connection is decreased.

Furthermore, in a case in which the wiring in the thickness direction (the Z axis direction) is provided by a via conductor (an interlayer connection conductor provided by filling conductive paste, for example), the via conductor is fired at a low temperature, so that the material of the via conductor is limited. In addition, since the via conductor is fired at a low temperature, the firing failure and insufficient strength of a via conductor easily occur, and a crack is easy to occur in the via conductor when bending stress is applied to the interposer. On the other hand, in the first preferred embodiment, a conductor pattern (the conductors 21 to 24) of a Cu foil, for example, is used for the wiring in the thickness direction, so that, even when bending stress is applied to the interposer, a crack is unlikely to occur in the wiring.

(f) In the first preferred embodiment, the plurality of insulating layers 11 and 12 (two or more insulating layers that are adjacent to each other) defining the stacked body 10 are made of a thermoplastic resin, for example. According to the configuration, the stacked body 10 is able to be easily provided by collectively pressing the stacked insulating layers 11 and 12, so that the number of steps of manufacturing the stacked body 10 and the cost are able to be reduced. In addition, with this configuration, an interposer capable of being easily plastically deformed and maintaining (holding) a desired shape is able to be achieved.

(g) The stacked body 10 of the interposer 301 includes a bent portion CR that bends so as to avoid the components 83 and 84 mounted on the first circuit board 101 and the component 92 mounted on the second circuit board 201. With this configuration, the effective occupation area of the interposer 301 is reduced, so that the mounting space of a component to the first circuit board 101 and the second circuit board 201 and the wiring space of the first circuit board 101 and the second circuit board 201 are easily ensured.

(h) In addition, in the first preferred embodiment, the interposer 301 is connected and fixed to the plurality of first lands of the first circuit board 101 through the plurality of first electrodes P11, P12, P13, and P14. Therefore, the interposer 301 capable of supporting the second circuit board 201 is able to be easily and stably mounted on the first circuit board 101.

(i) In the first preferred embodiment, the interposer 301 is connected and fixed to the plurality of second lands of the second circuit board 201 through the plurality of second electrodes P21, P22, P23, and P24. Therefore, the interposer 301 and the second circuit boards 201 are able to be mounted using solder, and the first circuit board 101 and the second circuit boards 201 are able to be bonded by the interposer 301 (substantially without unnecessary gaps), so that the interposer 301, the first circuit board 101, and the second circuit boards 201 are able to be disposed even in a small space in an electronic device.

In addition, since a gap is hardly generated between the interposer 301 and the second circuit board 201, as compared with a case in which the first circuit board 101 and the second circuit boards 201 are connected through a connector, the unnecessary radiation and energy loss due to leakage of electromagnetic waves are significantly reduced or prevented. Further, as compared with connection through a connector, impedance mismatching hardly occurs and a return loss is also significantly reduced or prevented.

(j) In the first preferred embodiment, the plurality of first electrodes P11, P12, P13, and P14 are disposed at equal or substantially equal intervals. With this configuration, mounting capability of the interposer 301 to the first element (the first circuit board 101) is improved, and the overall bonding strength is increased.

(k) In the first preferred embodiment, the plurality of second electrodes P21, P22, P23, and P24 are disposed at equal or substantially equal intervals. With this configuration, even when the interposer 301 has an elongated shape, the interposer 301 as well as other components are able to be solder-mounted on the first circuit board 101. In addition, with this configuration, mounting capability of the second circuit board 201 to the interposer 301 is improved, and the overall bonding strength is increased.

(l) The interposer 301 according to the first preferred embodiment has a smaller effective relative dielectric constant than the first circuit board 101 and the second circuit board 201. As a result, a capacitance component to be generated between the conductor patterns of the interposer 301 is able to be reduced. In general, a linear expansion coefficient of the circuit board on which components are mounted is preferably matched with a linear expansion coefficient of the components to be mounted, and a substrate, such as a glass epoxy substrate, including a filler such as glass fiber, for example, is conventionally used. On the other hand, since the interposer 301 includes less components than the first circuit board 101 or the second circuit board 201, the interposer 301 of the present preferred embodiment does not have such restrictions, so that the effective relative dielectric constant of the interposer 301 is able to be made smaller than the effective relative dielectric constant of the first circuit board 101 and the second circuit board 201.

(m) In the first preferred embodiment, the interposer 301 has a smaller effective elastic modulus than the first circuit board 101 and the second circuit board 201, and is able to deform. With this configuration, the degree of freedom in the shape of the interposer 301 is increased, and the interposer 301 is also able to be mounted in a location with some irregularities in a height direction, for example. In addition, since the interposer 301 has higher flexibility than the first circuit board 101 and the second circuit board 201, damage of a bonding portion (a bonding portion between the plurality of first electrodes P11, P12, P13, and P14 and the plurality of first lands, a bonding portion between the second electrodes P21, P22, P23, and P24 and the plurality of second lands) due to stress applied to the first circuit board 101 or the second circuit board 201 is significantly reduced or prevented.

It is to be noted that a plating film such as Ni/Au or Ni/Sn may preferably be applied on a surface of the plurality of first electrodes P11, P12, P13, and P14, and a surface of the plurality of second electrodes P21, P22, P23, and P24. The plating film applied on the surface of an electrode (the plurality of first electrodes P11, P12, P13, and P14 and the plurality of second electrodes P21, P22, P23, and P24) improves solder wettability. In addition, according to this configuration, oxidization or the like of the electrode is significantly reduced or prevented, and the chemical stability of the electrode is increased.

Moreover, application of a plating film on the surface of the plurality of first electrodes P11, P12, P13, and P14 is able to increase an area of the plurality of first electrodes P11, P12, P13, and P14. With this configuration, the mounting capability of the interposer 301 to the first circuit board 101 is improved, and the bonding strength (the bonding strength between the plurality of first electrodes P11, P12, P13, and P14 and the plurality of first lands of the first circuit board 101) between the interposer 301 and the first circuit board 101 is able to be increased.

Further, application of a plating film on the surface of the plurality of second electrodes P21, P22, P23, and P24 is able to increase an area of the plurality of second electrodes P21, P22, P23, and P24. With this configuration, the mounting capability of the second circuit board 201 to the interposer 301 is improved, and the bonding strength (the bonding strength between the plurality of second electrodes P21, P22, P23, and P24 and the plurality of second lands of the second circuit board 201) between the interposer 301 and the second circuit board 201 is able to be increased.

Second Preferred Embodiment

A second preferred embodiment of the present invention provides an example of an interposer including a ground conductor.

Figure 6A:
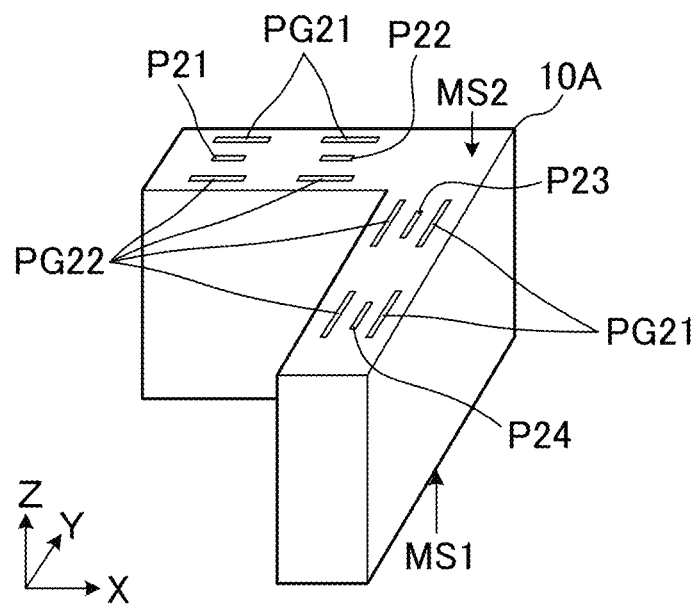
FIG. 6A is an external perspective view of an interposer 302 according to a second preferred embodiment of the present invention.
Figure 6B:
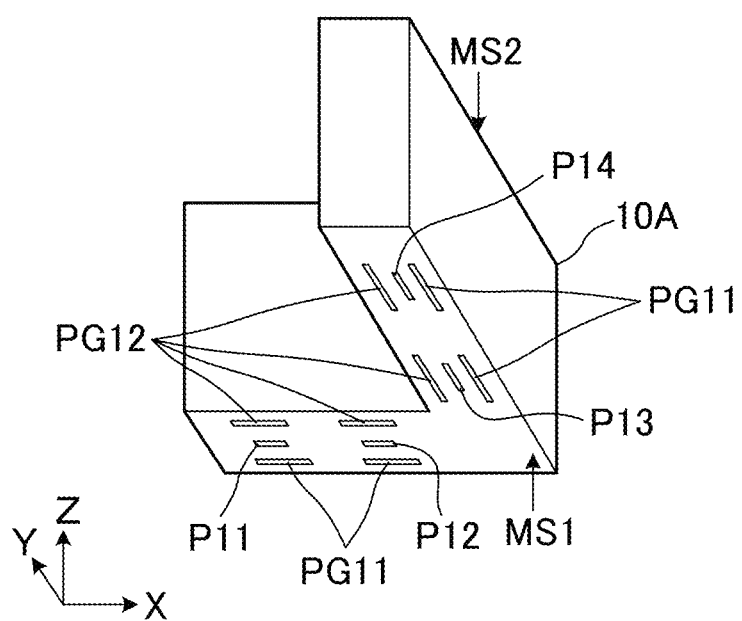
FIG. 6B is an external perspective view of the interposer 302 viewed from a different viewpoint.
Figure 7:
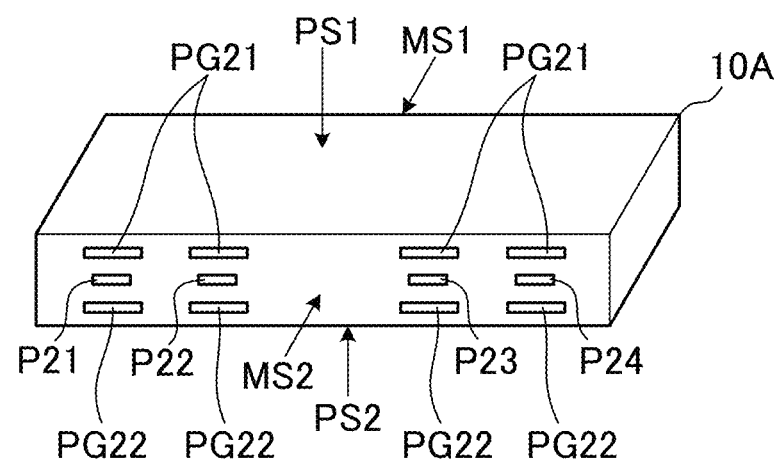
FIG. 7 is an external perspective view showing a state before the interposer 302 is folded.
Figure 7:
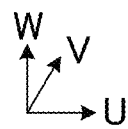

FIG. 6A is an external perspective view of an interposer 302 according to the second preferred embodiment of the present invention, and FIG. 6B is an external perspective view of the interposer 302 viewed from a different viewpoint. FIG. 7 is an external perspective view showing a state before the interposer 302 is folded.

The interposer 302 is different from the interposer 301 according to the first preferred embodiment in that the stacked body includes a ground conductor. In addition, the interposer 302 is different from the interposer 301 in that the interposer 302 includes a plurality of ground electrodes PG11, PG12, PG21, and PG22. Other configurations of the interposer 302 are the same as or similar to the configurations of the interposer 301.

Hereinafter, differences from the interposer 301 according to the first preferred embodiment of the present invention will be described.

The interposer 302 includes a stacked body 10A including a plurality of insulating layers that are stacked on each other, a plurality of first electrodes P11, P12, P13, and P14, a plurality of second electrodes P21, P22, P23, and P24, and a plurality of ground electrodes PG11, PG12, PG21, and PG22. The plurality of first electrodes P11 to P14 and the plurality of second electrodes P21 to P24 are the same or substantially the same as the plurality of first electrodes and the plurality of second electrodes described in the first preferred embodiment.

The stacked body 10A is provided such that a plate preferably made of a thermoplastic resin such as a liquid crystal polymer (LCP), for example, is folded into an L shape. The folded stacked body 10A is obtained, for example, by folding a vicinity of the center in the long-side direction of a rectangular or substantially rectangular parallelepiped-shaped stacked body 10A (a rectangular or substantially rectangular plate of which the long-side direction coincides with the U axis direction) shown in FIG. 7, into an L shape, by heating and pressing.

The plurality of ground electrodes PG11 and PG12 are provided on a first mounting surface MS1 of the stacked body 10A, and the plurality of ground electrodes PG21 and PG22 are provided on a second mounting surface MS2 of the stacked body 10A. As shown in FIG. 6B, the ground electrodes PG11 and PG12 are disposed so as to interpose each of the first electrodes P11, P12, P13, and P14 therebetween. As shown in FIG. 6A, the ground electrodes PG21 and PG22 are disposed so as to interpose each of the second electrodes P21, P22, P23, and P24 therebetween.

As will be described in detail later, a ground conductor (a conductor pattern) is provided inside (on a surface of an insulating layer) the stacked body 10A. The plurality of ground electrodes PG11, PG12, PG21, and PG22 are end surfaces (end portions) of the ground conductor that are exposed on the first mounting surface MS1 and the second mounting surface MS2.

In addition, the stacked body 10A, as shown in FIGS. 6A and 6B, includes a bent portion that is bent when viewed in the Z axis direction.

Figure 8:
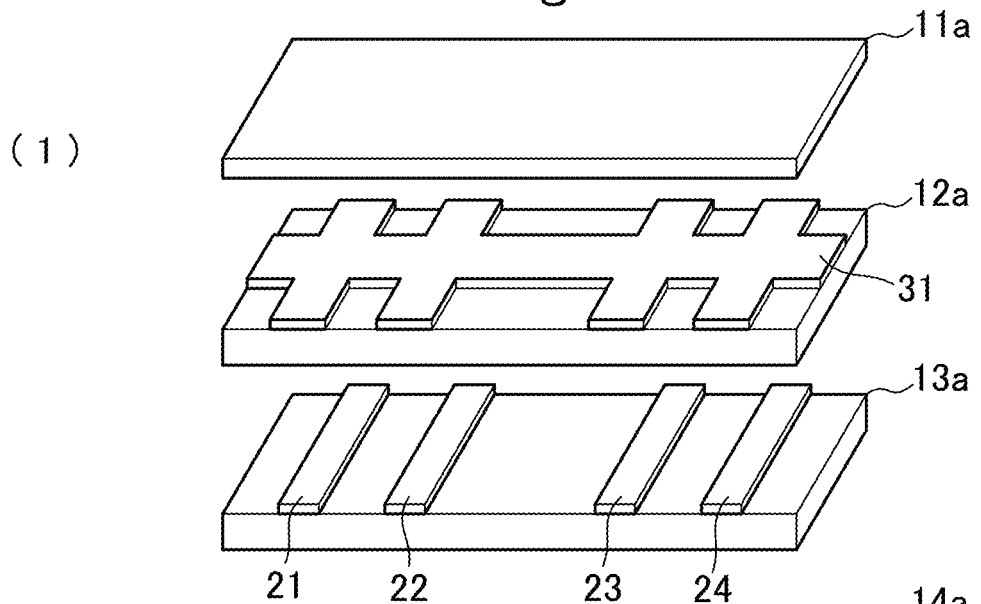
FIG. 8 is a perspective view sequentially showing steps of manufacturing the interposer 302 before being folded.
Figure 8:
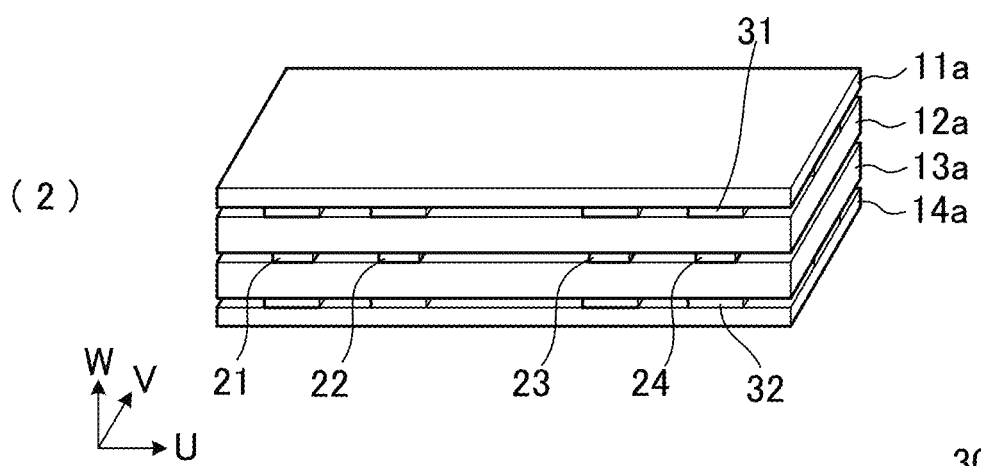
Figure 8:
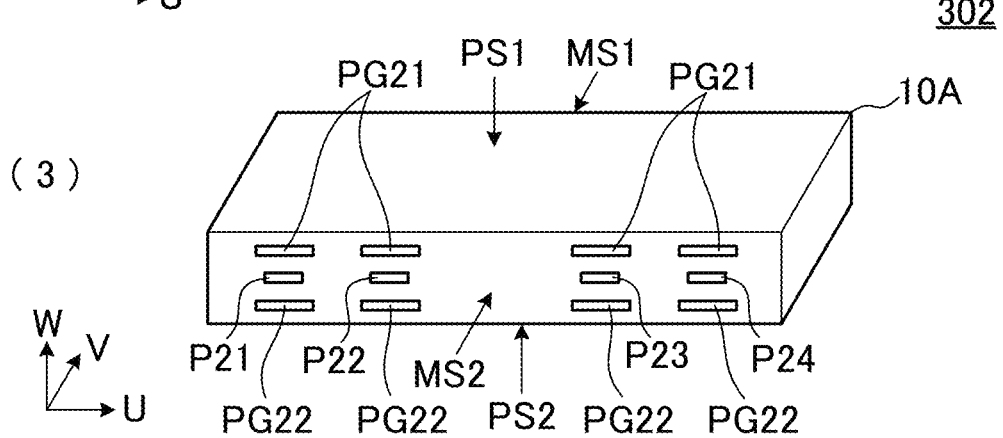

The interposer 302 according to the second preferred embodiment is preferably manufactured by, for example, the following steps. FIG. 8 is a perspective view sequentially showing steps of manufacturing the interposer 302 before being folded.

First, as shown in step (1) in FIG. 8, a plurality of insulating layers 11a, 12a, 13a, and 14a having flexibility are prepared. The plurality of insulating layers 11a, 12a, 13a, and 14a are rectangular resin plates having a substantially same shape. The plurality of insulating layers 11a, 12a, 13a, and 14a are preferably sheets made of a thermoplastic resin such as a liquid crystal polymer (LCP), for example.

Subsequently, linear conductors 21, 22, 23, and 24 are provided on the insulating layer 13a. Specifically, a metal foil (a Cu foil, for example) is laminated on one (a front surface) of the principal surfaces of the insulating layer 12a in a collective state, and the metal foil is patterned by photolithography, for example. As a result, the conductors 21, 22, 23, and 24 are provided on the surface of the insulating layer 13a.

In addition, a planar ground conductor 31 is provided on the insulating layer 12a, and a planar ground conductor 32 is provided on the insulating layer 14a. Specifically, a metal foil (a Cu foil, for example) is laminated on one (a front surface) of the principal surfaces of the insulating layers 12a and 14a in a collective substrate state, and the metal foil is patterned by photolithography, for example. Accordingly, the ground conductor 31 is provided on the surface of the insulating layer 12a, and the ground conductor 32 is provided on the surface of the insulating layer 14a.

The ground conductors 31 and 32 have the same or substantially same shape and include conductor portions and opening portions. As shown in step (1) in FIG. 8, the conductor portions of the ground conductors 31 and 32 are entirely or substantially entirely overlapped with the conductors 21, 22, and 23 and the 24 when the plurality of insulating layers 11a, 12a, 13a and 14a are stacked on each other.

Subsequently, as shown in step (2) in FIG. 8, the plurality of insulating layers 14a, 13a, 12a, and 11a are stacked in this order, and then the stacked insulating layers 11a, 12a, 13a, and 14a are heated and pressed to form a stacked body.

Finally, the stacked body in a collective substrate state is divided to obtain an individual interposer 302 (a rectangular or substantially rectangular parallelepiped-shaped stacked body 10A) as shown in step (3) in FIG. 8.

The interposer 302 according to the second preferred embodiment includes a transmission line of a stripline structure including the conductor 21, the ground conductors 31 and 32, the insulating layer 12a interposed between the conductor 21 and the ground conductor 31, and the insulating layer 13a interposed between the conductor 21 and the ground conductor 32. It is to be noted that not only the transmission line including the conductor 21 but a transmission line including the conductors 22 to 24 is similarly configured. In other words, the interposer 302 includes four transmission lines.

Figure 9:
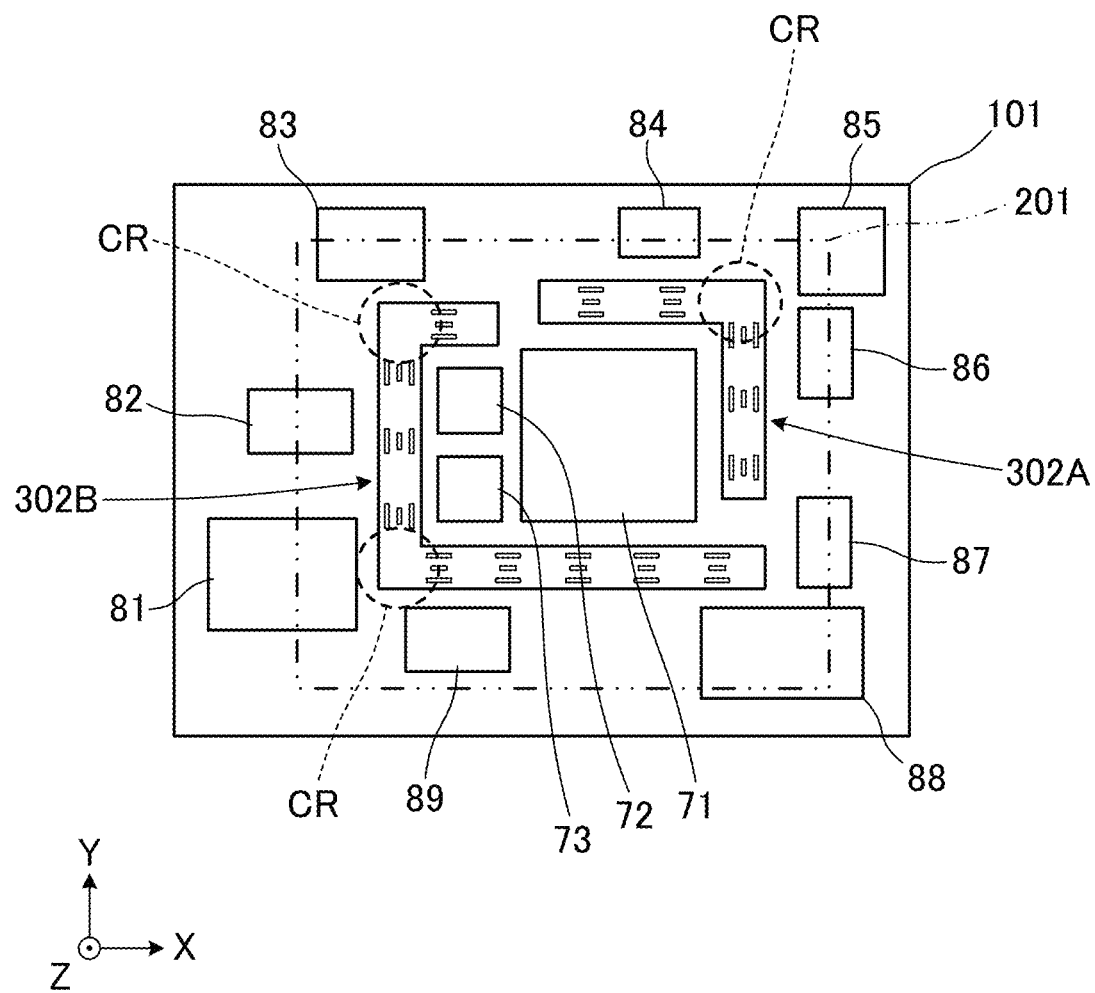
FIG. 9 is a plan view showing a main portion of an electronic device 402 according to the second preferred embodiment of the present invention.

Subsequently, an electronic device including a plurality of interposers according to the second preferred embodiment of the present invention will be described with reference to the drawings. FIG. 9 is a plan view showing a main portion of an electronic device 402 according to the second preferred embodiment of the present invention. In FIG. 9, in order to make the structure more understandable, the second circuit board 201 is indicated by an alternate long and two short dashes line.

The electronic device 402 is different from the electronic device 401 described in the first preferred embodiment in that the electronic device 402 includes a plurality of interposers 302A and 302B. In addition, the electronic device 402 is different from the electronic device 401 in that the electronic device 402 includes components 71, 72, 73, 81, 82, 83, 84, 85, 86, 87, 88, and 89 on the upper surface (a surface) of the first circuit board 101. Other configurations of the electronic device 402 are the same or substantially the same as the configurations of the electronic device 401.

Hereinafter, differences from the electronic device 401 according to the first preferred embodiment of the present invention will be described.

The interposers 302A and 302B are different in the number of transmission lines from the interposer 302. As shown in FIG. 9, the interposer 302A includes five transmission lines, and the interposer 302B includes nine transmission lines. The interposer 302A is provided such that a plate made of a thermoplastic resin is folded into an L shape, and the interposer 302B is provided such that a plate made of a thermoplastic resin is folded into a U shape.

As shown in FIG. 9, the plurality of interposers 302A and 302B are disposed in a frame (ring) shape so as to avoid components (the components 71 to 73 and 81 to 89 mounted on the upper surface of the first circuit board 101 and components mounted on the lower surface of the second circuit board 201). Specifically, in a plan view (viewed in the Z axis direction) of the upper surface of the first circuit board 101, the schematic outer shape of the plurality of interposers 302A and 302B disposed in a frame shape is preferably a rectangle or substantially a rectangle. The components 81 to 88 are disposed (so as to surround the plurality of interposers 302A and 302B) outside of the schematic outer shape of the interposers 302A and 302B. The plurality of interposers 302A and 302B surround the components 71 to 73. The components 71 to 73 and 81 to 89 are preferably, for example, chip components such as chip inductors and chip capacitors.

It is to be noted that, as shown in FIG. 9, in at least three top portions of the rectangular or substantially rectangular schematic outer shape of the plurality of interposers 302A and 302B disposed in a frame shape, the interposers 302A and 302B (stacked bodies) are interposed between the first circuit board 101 and the second circuit board 201. A plurality of first electrodes of the interposers 302A and 302B, and a plurality of ground electrodes (see the first electrodes P11, P12, P13, and P14, and the ground electrodes PG11 and PG12 shown in FIG. 6B) are respectively directly soldered to a plurality of first lands provided on the upper surface of the first circuit board 101. A plurality of second electrodes of the interposers 302A and 302B, and a plurality of ground electrodes (see the second electrodes P21, P22, P23, and P24, and the ground electrodes PG21 and PG22 shown in FIG. 6A) are respectively directly soldered to a plurality of second lands provided on the lower surface of the second circuit board 201.

Accordingly, the first circuit board 101 and the second circuit board 201 are electrically connected to each other through the plurality of interposers 302A and 302B.

According to the electronic device 402 of the second preferred embodiment of the present invention, the following advantageous effects in addition to the advantageous effects described in the first preferred embodiment are obtained.

(n) According to the second preferred embodiment, even when the first circuit board 101 and the second circuit board 201 have large areas, the mounting capability of the interposer to the first circuit board 101 and the second circuit board 201 is improved, so that the overall bonding strength (the bonding strength between the first circuit board 101 and the interposer, the bonding strength between the second circuit board 201 and the interposer) is able to be increased. In the second preferred embodiment, in particular, in at least three top portions of the schematic outer shape being a rectangle or substantially a rectangle, the interposers 302A and 302B (stacked body) are interposed between the first circuit board 101 and the second circuit board 201, so that the structure supporting the second circuit board 201 by the interposer may be stabilized.

(o) In the second preferred embodiment, the plurality of interposers 302A and 302B are disposed in a frame (ring) shape so as to avoid components (the components 71 to 73 and 81 to 89 mounted on the upper surface of the first circuit board 101 and components mounted on the lower surface of the second circuit board 201). With this configuration, an area required to mount an interposer and components is able to be reduced (it is possible to save space).

It is to be noted that, in the interposers 302, 302A, and 302B according to the preferred embodiments of the present invention, the stacked body includes planar ground conductors (conductor patterns) 31 and 32. According to this configuration, by the shielding effect by a ground conductor, emission of noise from the components 71 to 73 surrounded by the interposers 302A and 302B is significantly reduced, or the influence of noise on the components 71 to 73 surrounded by the interposers 302A and 302B is able to be significantly reduced. In addition, the interposers 302A and 302B including the planar ground conductors are disposed between the components 71 to 73 and the components 81 to 89, so that isolation between the components 71 to 73 and the components 81 to 89 is able to be increased.

Third Preferred Embodiment

A third preferred embodiment of the present invention provides an example of an interposer of which the outer shape is ring-shaped.

Figure 10:
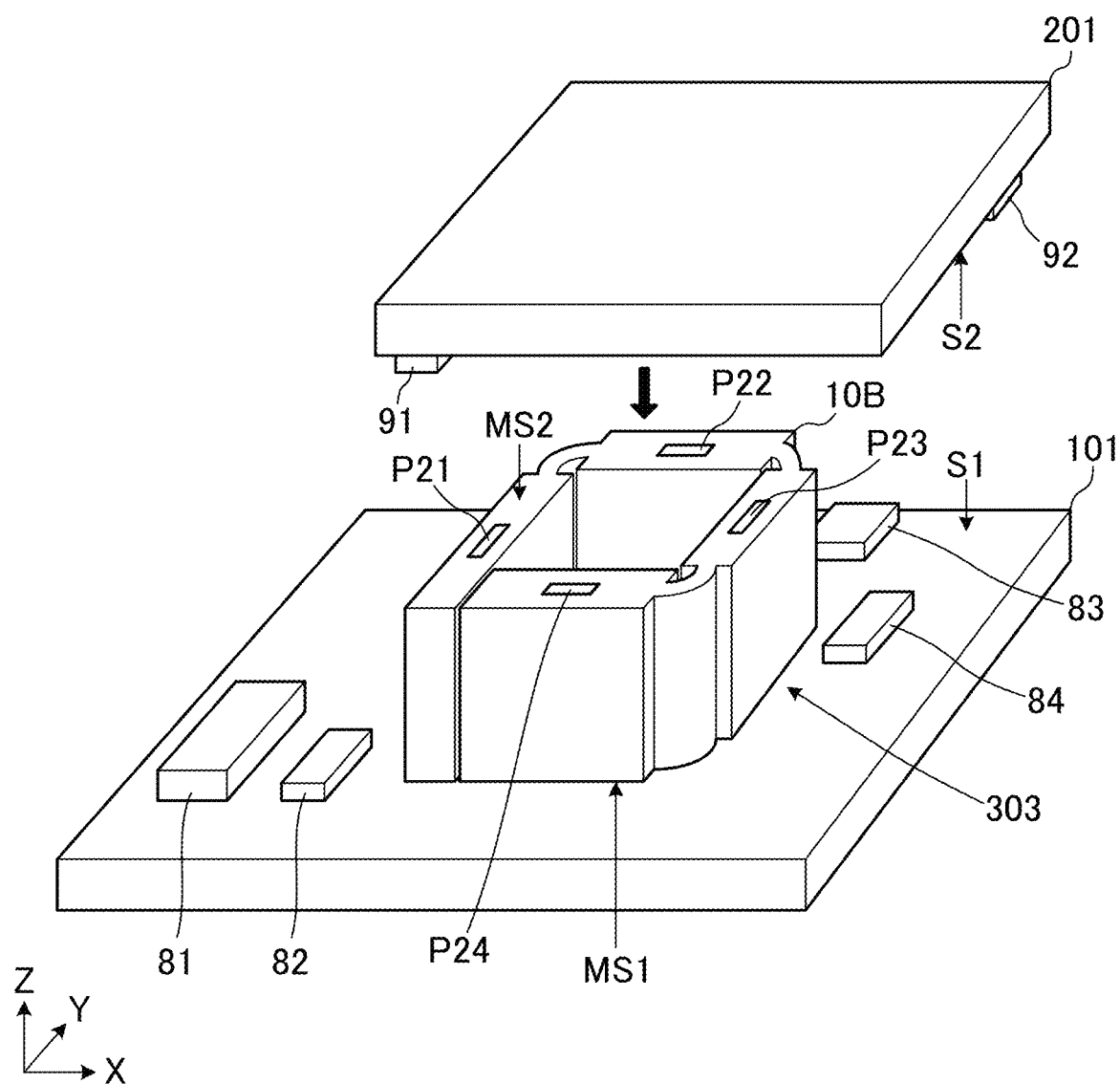
FIG. 10 is an external perspective view showing a main portion of an electronic device 403 according to a third preferred embodiment of the present invention.
Figure 11:
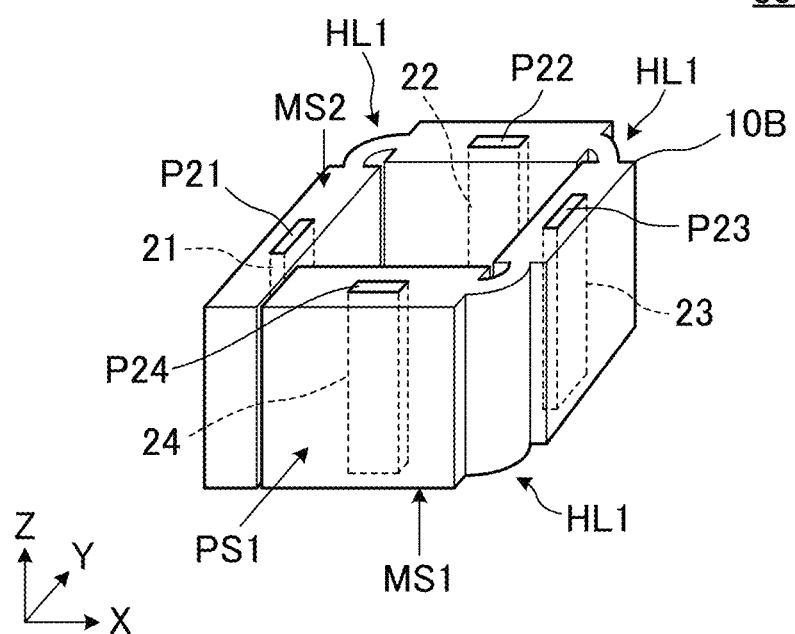
FIG. 11 is an external perspective view of an interposer 303 according to the third preferred embodiment of the present invention.
Figure 12A:
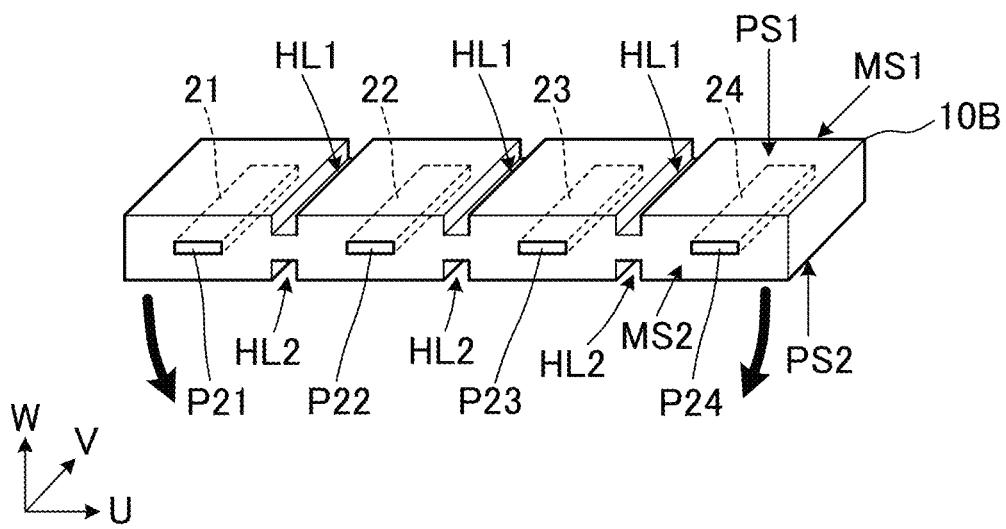
FIG. 12A is an external perspective view showing a state before the interposer 303 is folded.

FIG. 10 is an external perspective view showing a main portion of an electronic device 403 according to a third preferred embodiment of the present invention. FIG. 11 is an external perspective view of an interposer 303 according to the third preferred embodiment of the present invention. FIG. 12A is an external perspective view showing a state before the interposer 303 is folded, and FIG. 12B is a plan view showing a state before the interposer 303 is folded.

The electronic device 403 is different from the electronic device 401 according to the first preferred embodiment in that the electronic device 403 includes an interposer 303. The interposer 303 is different from the interposer 301 according to the first preferred embodiment in that the interposer 303 includes a stacked body 10B folded into a ring shape. Other configurations of the electronic device 403 are the same or substantially the same as the configurations of the electronic device 401.

Hereinafter, differences from the electronic device 401 according to the first preferred embodiment of the present invention will be described.

Figure 12B:
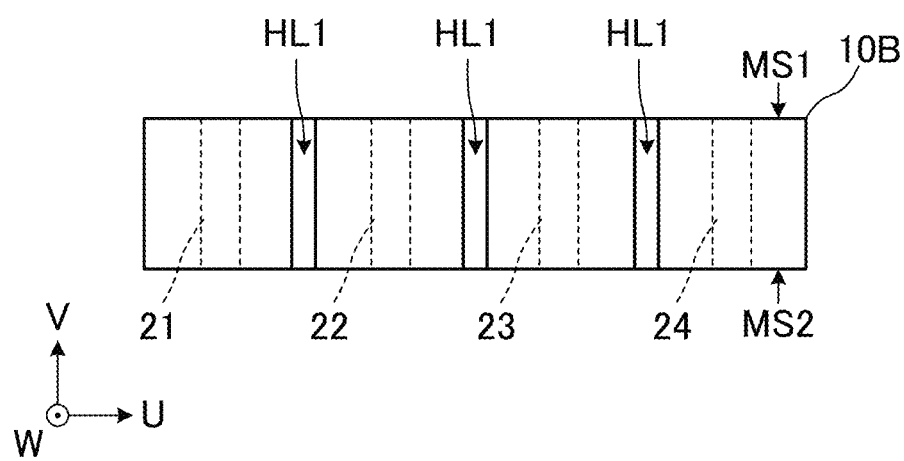
FIG. 12B is a plan view showing a state before the interposer 303 is folded.

The folded stacked body 10B is obtained, for example, by being folded into a ring shape with a bottom surface PS2 of a rectangular or substantially rectangular parallelepiped stacked body 10B (a substantially rectangular plate of which the long-side direction coincides with the U axis direction) shown in FIGS. 12A and 12B facing inward. Opposite end portions (left end portion and right end portion of the stacked body 10B shown in FIGS. 12A and 12B) of the stacked body 10B, the opposite end portions being brought into close contact with each other when the stacked body 10B is folded into a ring shape, are connected with a not-shown adhesive material.

The stacked body 10B includes a plurality of concave portions HL1 and HL2 provided in a portion to be folded. Although described in detail later, the concave portions HL1 and HL2 include a smaller number of stacked insulating layers than other portions. Therefore, the portions including the concave portions HL1 and HL2 are folded more easily than the other portions.

The concave portion HL1 is provided on a top surface PS1 of the stacked body 10B shown in FIGS. 12A and 12B and extends in a short-side direction (a V axis direction). The concave portion HL2 is provided on the bottom surface PS2 of the stacked body 10B shown in FIGS. 12A and 12B and extends in a short-side direction (a V axis direction). The concave portions HL1 and HL2, when viewed in the stacking direction (a W axis direction) of the plurality of insulating layers, are substantially overlapped with each other.

The stacked body 10B includes an upright portion. In the third preferred embodiment, the entire or substantially the entire stacked body 10B is the upright portion. In addition, the stacked body 10B includes a bent portion that is bent in a plan view of the first mounting surface MS1 and the second mounting surface MS2.

Figure 13:
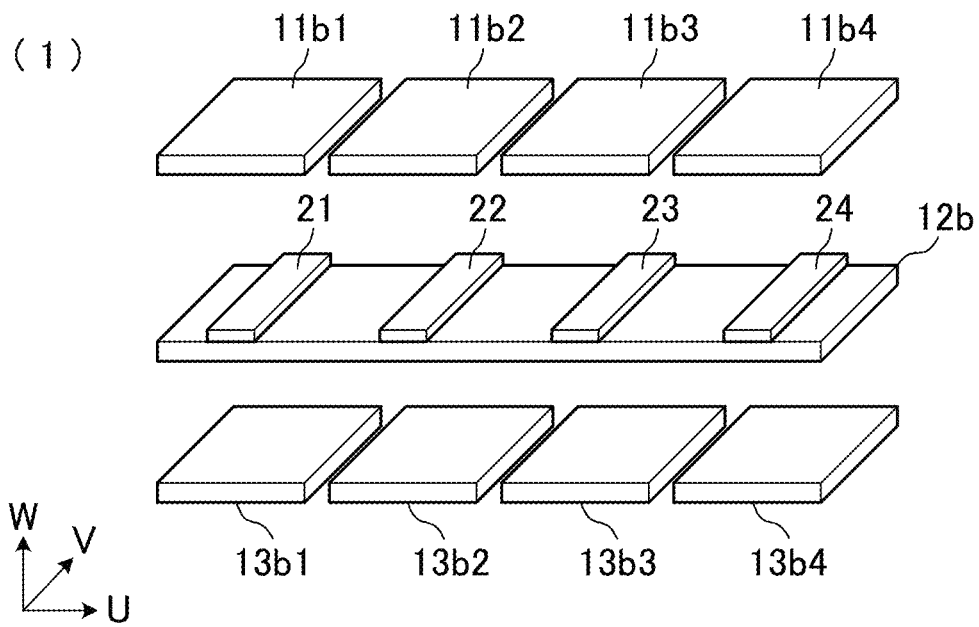
FIG. 13 is a perspective view sequentially showing steps of manufacturing the interposer 303 before being folded.
Figure 13:
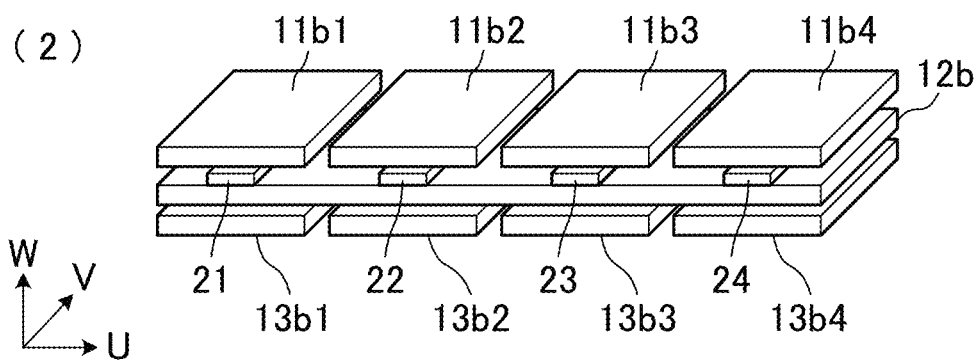
Figure 13:
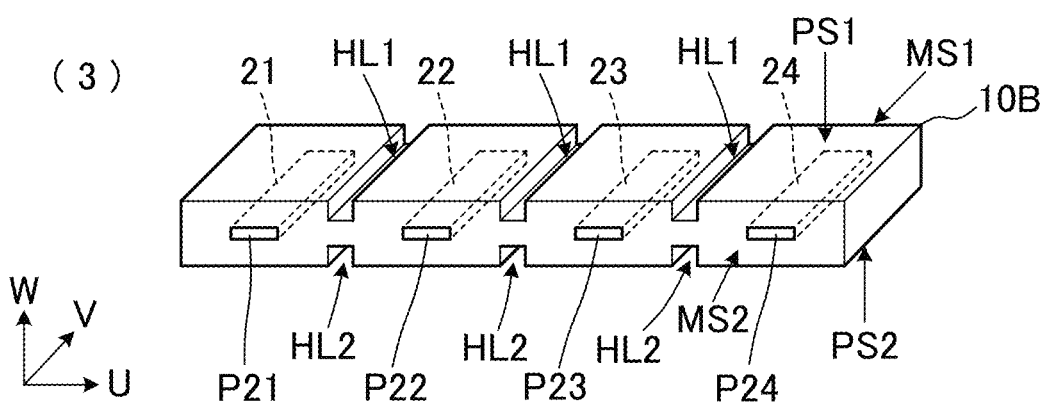

The interposer according to the third preferred embodiment is preferably manufactured by, for example, the following steps. FIG. 13 is a perspective view sequentially showing steps of manufacturing the interposer 303 before being folded.

First, as shown in step (1) in FIG. 13, a plurality of insulating layers 11$b$1, 11$b$2, 11$b$3, 11$b$4, 12$b$, 13$b$1, 13$b$2, 13$b$3, and 13$b$4 that have flexibility are prepared. The insulating layer 12$b$ is a rectangular or rectangular resin plate. The plurality of insulating layers 11$b$1 to 11$b$4, and 13$b$1 to 13$b$4 are rectangular or substantially rectangular resin plates having a substantially same shape. The insulating layers 11$b$1 to 11$b$4 and 13$b$1 to 13$b$4 are shorter in the long-side direction (the U axis direction) than the insulating layer 12$b$. The plurality of insulating layers 11$b$1 to 11$b$4, 12$b$, and 13$b$1 to 13$b$4 are preferably sheets made of a thermoplastic resin such as a liquid crystal polymer (LCP), for example.

Subsequently, conductors 21, 22, 23, and 24 are provided on a surface of the insulating layer 12$b$. Specifically, a metal foil (a Cu foil, for example) is laminated on one (a front surface) of the principal surfaces of the insulating layer 12$b$ in a collective substrate state, and the metal foil is patterned by photolithography, for example. As a result, the conductors 21, 22, 23, and 24 are provided on the surface of the insulating layer 12$b$.

Subsequently, as shown in step (2) in FIG. 13, the plurality of insulating layers 13$b$1 to 13$b$4, 12$b$, and 11$b$1 to 11$b$4 are stacked on each other. The insulating layers 11$b$1, 11$b$2, 11$b$4, and 11$b$4 are disposed in this order in the positive U direction, and the insulating layers 13$b$1, 13$b$2, 13$b$3, and 13$b$4 are disposed in this order in the positive U direction.

When the plurality of insulating layers are stacked, the insulating layers 13$b$1, 12$b$, and 11$b$1 are stacked in this order. The insulating layers 13$b$2, 12$b$, and 11$b$2 are stacked in this order. The insulating layers 13$b$3, 12$b$, and 11$b$3 are stacked in this order. The insulating layers 13$b$4, 12$b$, and 11$b$4 are stacked in this order.

Subsequently, the stacked insulating layers 11$b$1 to 11$b$4, 12$b$, and 13$b$1 to 13$b$4 are heated and pressed to provide a stacked body.

When the stacked body is provided, a portion (a portion including the smaller number of stacked insulating layers) in which the insulating layers 11$b$1 to 11$b$4 are not stacked above the insulating layer 12$b$ includes a concave portion HL1 due to a difference in the number of stacked insulating layers. In addition, a portion in which the insulating layers 13$b$1 to 13$b$4 are not stacked underneath the insulating layer 12$b$ includes a concave portion HL2 due to a difference in the number of stacked insulating layers. The concave portions HL1 and HL2 include the smaller number of stacked insulating layers than other portions. Therefore, the portions including the concave portions HL1 and HL2 are folded more easily than the other portions.

Finally, the stacked body in a collective substrate state is divided to obtain an individual interposer 303 (a rectangular or substantially rectangular parallelepiped-shaped stacked body 10B) as shown in step (3) in FIG. 13.

According to the electronic device 403 of the third preferred embodiment of the present invention, the following advantageous effects in addition to the advantageous effects described in the first preferred embodiment are obtained.

(p) In the third preferred embodiment, the stacked body 10B includes the concave portions (the concave portions including the smaller number of stacked insulating layers than other portions) HL1 and HL2 provided in a portion to be folded. With this configuration, the stacked body is easily folded, which makes it possible to easily provide an interposer of a desired shape. In addition, with this configuration, the bend radius of the folded portion is able to be reduced.

(q) In the third preferred embodiment, the stacked body 10B of a rectangular or substantially rectangular parallelepiped shape is folded to provide an interposer 303 of which the outer shape is ring-shaped. Therefore, as described below, compared with a case in which an interposer of which the plane shape is ring-shaped is divided from a mother substrate, the number of interposers to be obtained by dividing the mother substrate is able to be increased.

Figure 14A:
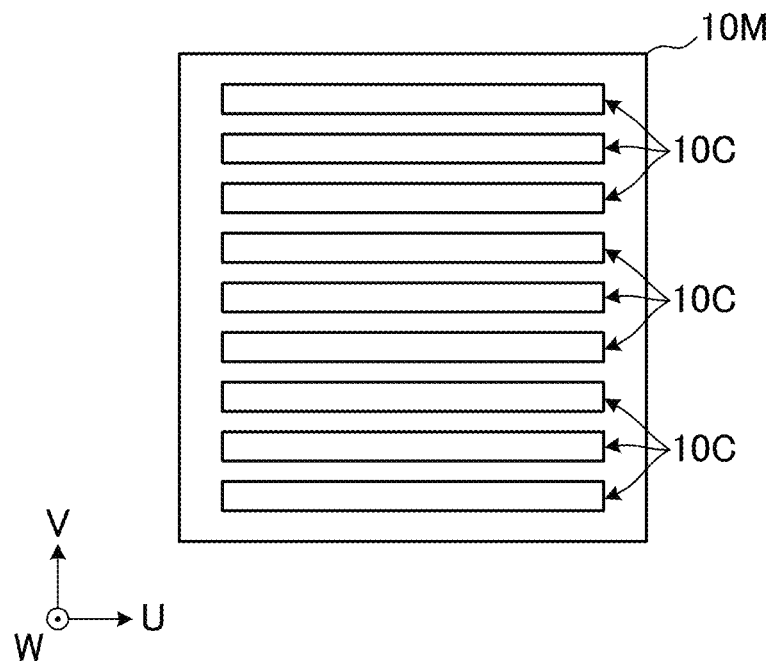
FIG. 14A is a plan view showing a plurality of stacked bodies 10C divided from a mother substrate 10M.
Figure 14B:
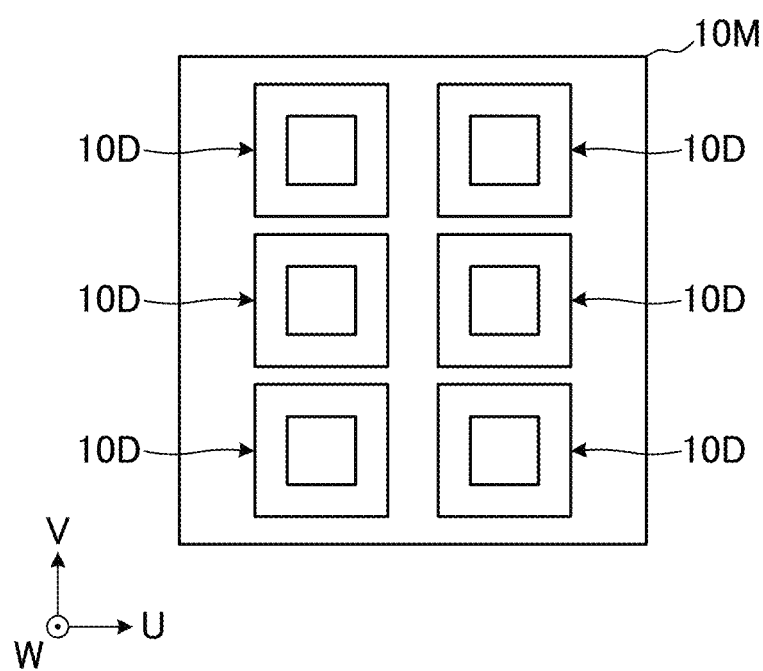
FIG. 14B is a plan view showing a plurality of stacked bodies 10D divided from a mother substrate 10M.

FIG. 14A is a plan view showing a plurality of stacked bodies 10C divided from a mother substrate 10M, and FIG. 14B is a plan view showing a plurality of stacked bodies 10D divided from a mother substrate 10M. As shown in FIG. 14B, in a case in which a stacked body 10D of which the plane shape is ring-shaped is divided, the number of interposers (the stacked bodies 10D) to be obtained by dividing from the mother substrate 10M is small. On the other hand, in a case in which a stacked body 10C of which the plane shape is rectangular or substantially rectangular is divided, as shown in FIG. 14A, the number of interposers (the stacked bodies 10C) to be obtained by dividing from the mother substrate 10M is able to be increased.

It is to be noted that, while the third preferred embodiment of the present invention provides an example in which the opposite end portions in the long-side direction of the stacked body 10B, that come into contact with each other when the stacked body 10B is folded into a ring shape are connected with an adhesive material, the present invention is not limited to such a configuration. The opposite end portions in the long-side direction of the stacked body 10B folded into a ring shape may not be connected with an adhesive material.

In addition, while the third preferred embodiment of the present invention provides an example in which the concave portion HL1 is provided on the top surface PS1 of the stacked body 10B, and the concave portion HL2 is provided on the bottom surface PS2 of the stacked body 10B, the present invention is not limited to such a configuration. The concave portion may be provided only on the top surface PS1 of the stacked body or may be provided only on the bottom surface PS2 of the stacked body.

It is to be noted that, while the third preferred embodiment of the present invention provides an example in which the concave portions HL1 and HL2 including the smaller number of stacked insulating layers than other portions are provided in the folded portion of the stacked body 10B, the present invention is not limited to such a configuration. The folded portion of the stacked body may include a cutout (a groove). The cutout, for example, is provided by grinding the top surface (or the bottom surface) of the stacked body using a laser. A portion including the cutout is folded more easily than other portions. Accordingly, the cutout is provided in the folded portion, which obtains similar advantageous effects to the case in which the concave portion is provided (see the above (p)).

It is to be noted that the cutout is not limited to the cutout provided on the top surface PS1 or the bottom surface PS2 of the stacked body 10B and may be provided on an end surface (the first mounting surface MS1 or the second mounting surface MS2) of the stacked body 10B. Furthermore, the stacked body may include both the concave portion and the cutout.

Fourth Preferred Embodiment

A fourth preferred embodiment of the present invention provides an example of a stacked body including a link portion.

Figure 15A:
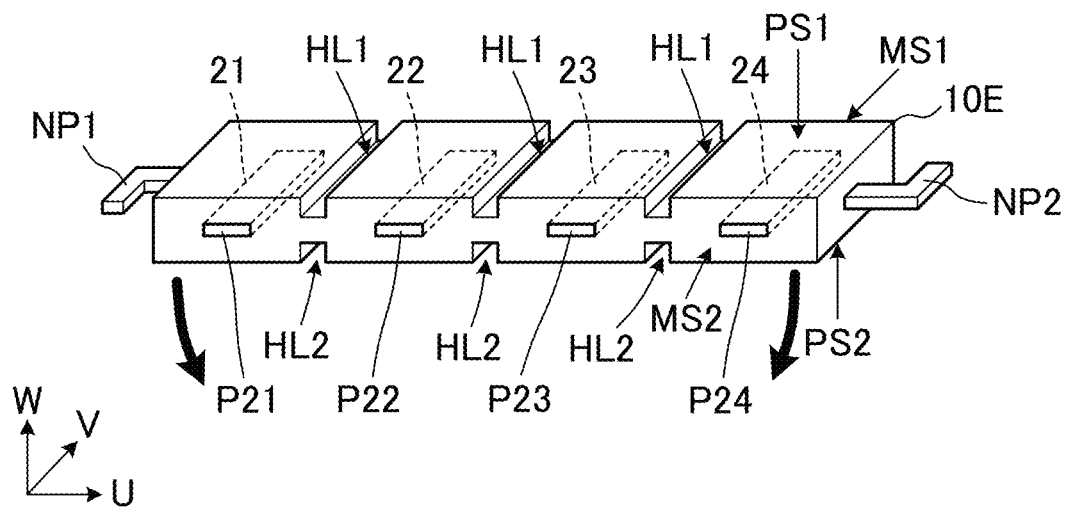
FIG. 15A is an external perspective view showing a state before an interposer 304 according to a fourth preferred embodiment of the present invention is folded.
Figure 15B:
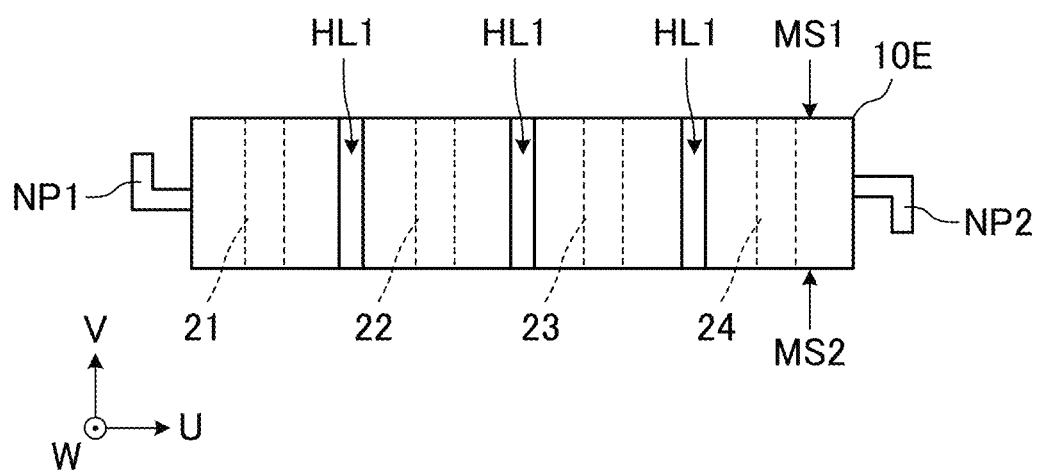
FIG. 15B is a plan view showing the state before the interposer 304 is folded.

FIG. 15A is an external perspective view showing a state before an interposer 304 according to the fourth preferred embodiment of the present invention is folded, and FIG. 15B is a plan view showing the state before the interposer 304 is folded.

The interposer 304 is different from the interposer 303 described in the third preferred embodiment in that a stacked body 10E includes link portions NP1 and NP2. Other configurations of the interposer 304 are the same as or similar to the configurations of the interposer 303.

Hereinafter, differences from the interposer 303 according to the third preferred embodiment of the present invention will be described.

The interposer 304, as with the interposer 303 described in the third preferred embodiment, includes a stacked body 10E folded into a ring shape.

The folded stacked body 10E is obtained, for example, by being folded into a ring shape with a bottom surface PS2 of a rectangular or substantially rectangular stacked body 10E (a rectangular or substantially rectangular plate of which the long-side direction coincides with the U axis direction) shown in FIGS. 15A and 15B facing inward. The stacked body 10E, as shown in FIG. 15A, includes a link portion NP1 having an L shape at one end in the long-side direction and a link portion NP2 having an L shape at the other end in the long-side direction.

Opposite end portions of the stacked body 10E folded into a ring shape are connected by the link portions NP1 and NP2. Specifically, the link portions NP1 and NP2 are hooked to each other, so that the opposite end portions of the stacked body 10E are fixed.

Fifth Preferred Embodiment

A fifth preferred embodiment of the present invention provides an example of an interposer different in the manner of folding a stacked body from the above-described interposers.

Figure 16:
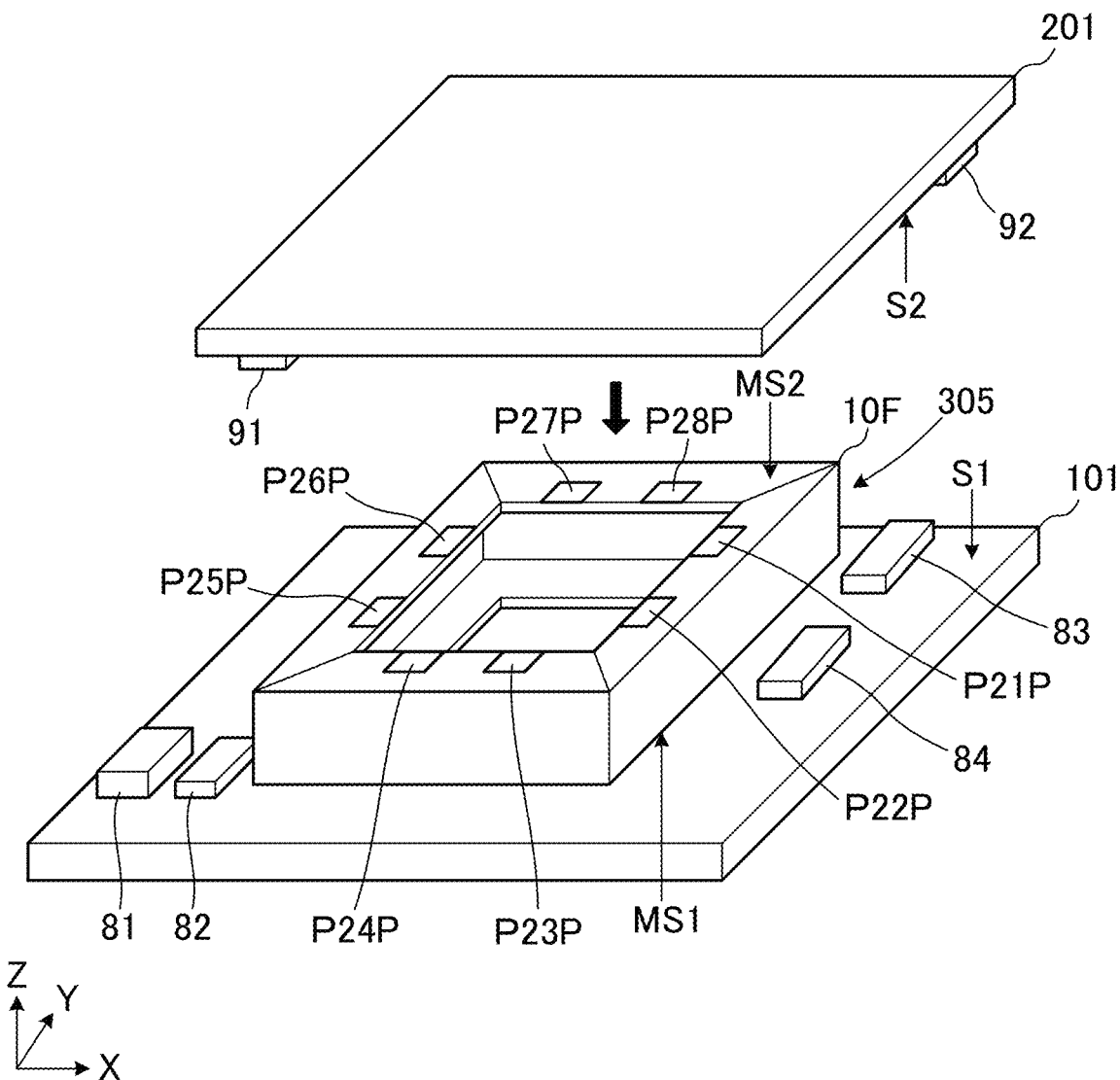
FIG. 16 is an external perspective view showing a main portion of an electronic device 405 according to a fifth preferred embodiment of the present invention.
Figure 17A:
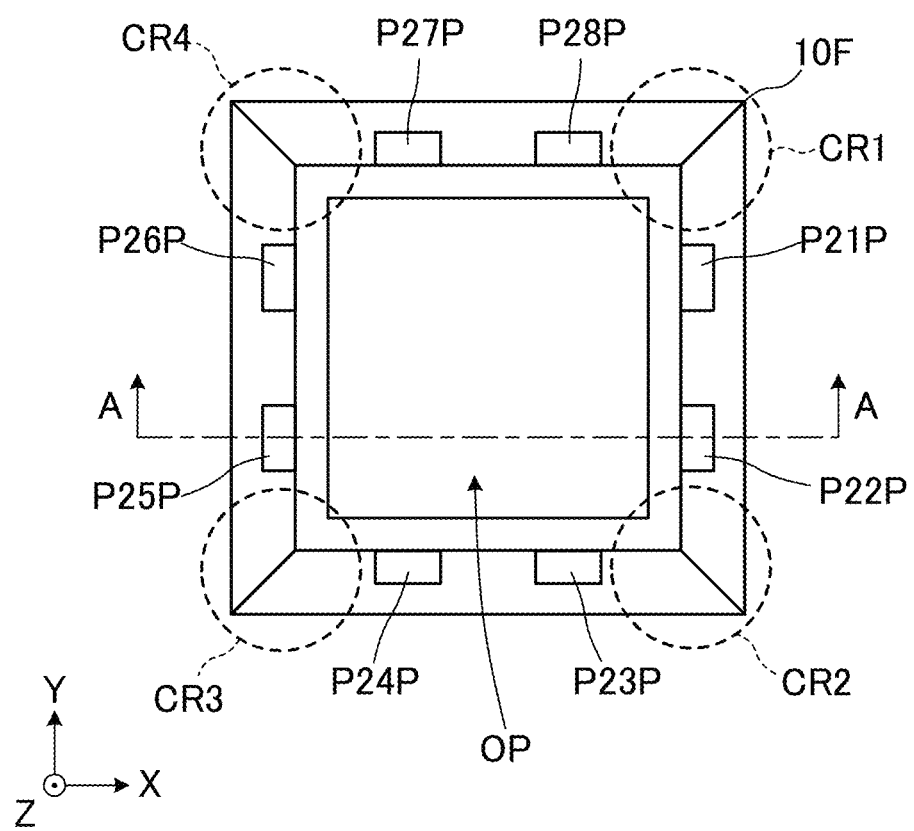
FIG. 17A is a plan view of an interposer 305 according to the fifth preferred embodiment of the present invention.
Figure 17B:
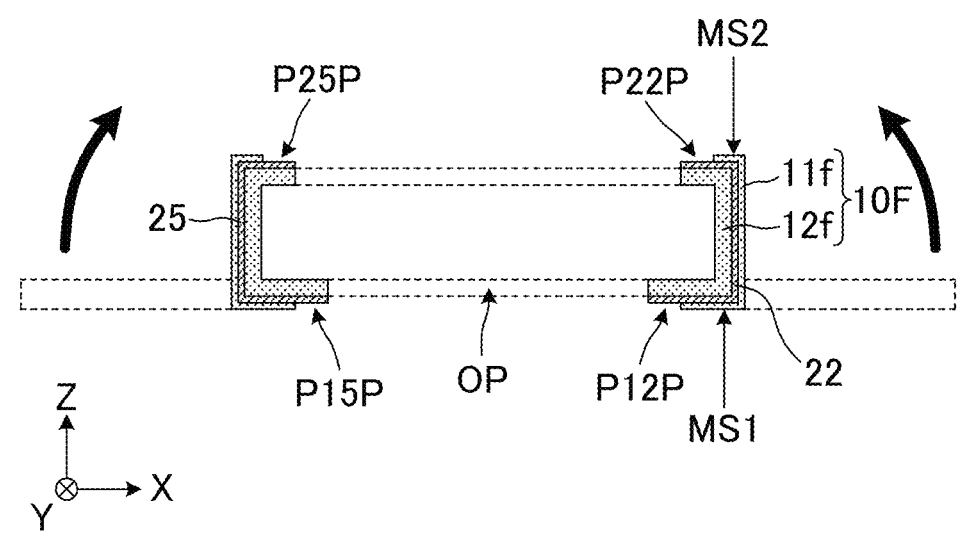
FIG. 17B is an A-A cross-sectional view in FIG. 17A.
Figure 18:
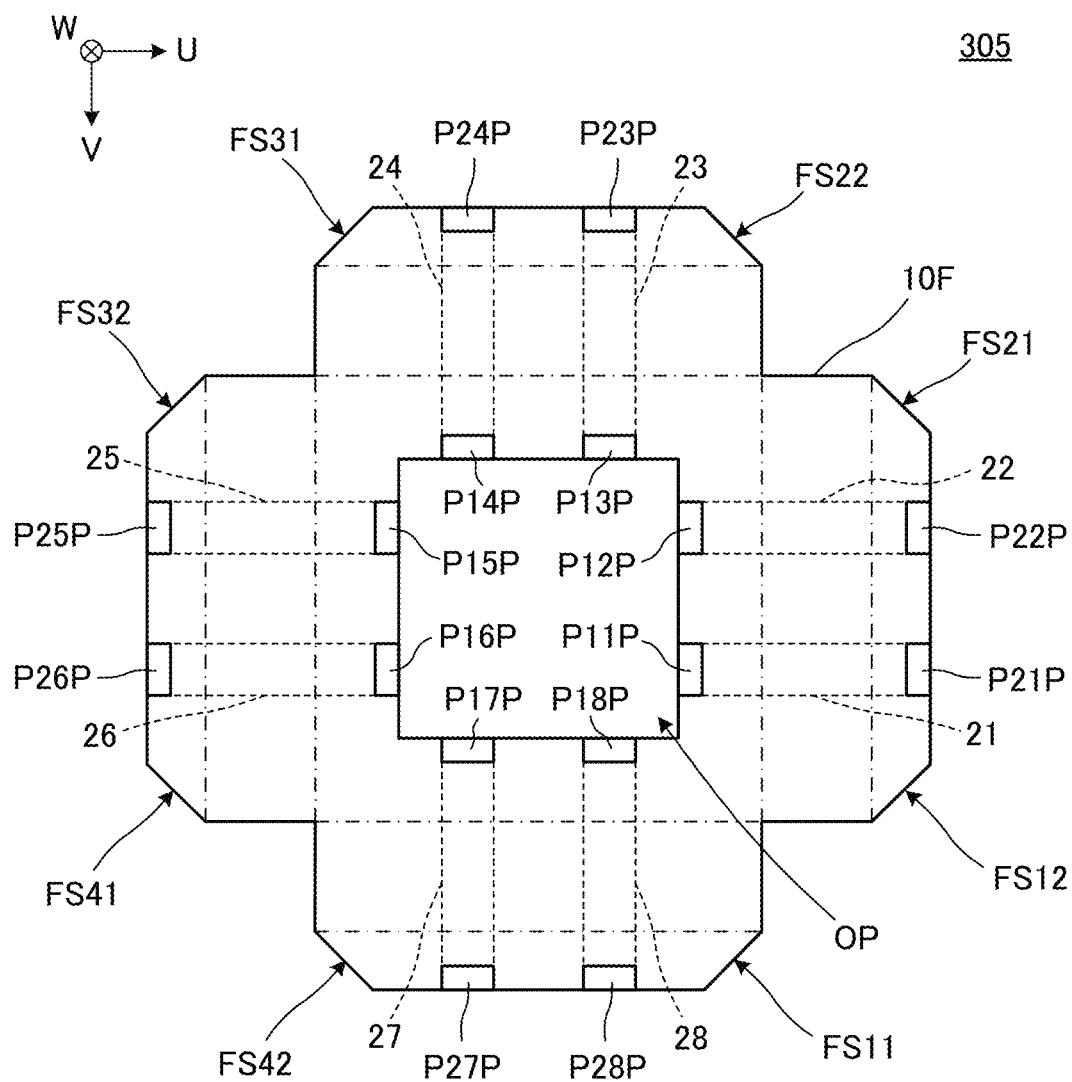
FIG. 18 is a plan view showing a state before the interposer 305 is folded.

FIG. 16 is an external perspective view showing a main portion of an electronic device 405 according to the fifth preferred embodiment of the present invention. FIG. 17A is a plan view of an interposer 305 according to the fifth preferred embodiment of the present invention, and FIG. 17B is an A-A cross-sectional view in FIG. 17A. FIG. 18 is a plan view showing a state before the interposer 305 is folded. In addition, in FIG. 18, a portion to be folded outward is indicated by an alternate long and short dash line.

The electronic device 405 is different from the electronic device 401 according to the first preferred embodiment in that the electronic device 405 includes an interposer 305. Other configurations of the electronic device 405 are the same as or similar to the configurations of the electronic device 401.

Hereinafter, differences from the electronic device 401 according to the first preferred embodiment of the present invention will be described.

The interposer 305 includes a stacked body 10F folded into a ring shape, a plurality of first electrodes P11P, P12P, P13P, P14P, P15P, P16P, P17P, and P18P, and a plurality of second electrodes P21P, P22P, P23P, P24P, P25P, P26P, P27P, and P28P.

The stacked body 10F folded into a ring shape is obtained, for example, by folding the stacked body 10F (of which the outer shape is a plate of a cross shape or a substantially cross shape) shown in FIG. 18 outward along a folding line (an alternate long and short dash line in FIG. 18). A rectangular or substantially rectangular opening OP is provided at the center of the stacked body 10F shown in FIG. 18.

The stacked body 10F before being folded includes portions provided in a portion of the outer shape, the portions being brought into close contact with each other when the stacked body 10F is folded into a ring shape. Specifically, sides (a side FS11 and a side FS12, a side FS21 and a side FS22, a side FS31 and a side FS32, and a side FS41 and a side FS42 that are shown in FIG. 18, for example) being a portion of all sides of the stacked body 10F shown in FIG. 18, when the stacked body 10F is folded, come in close contact with each other.

The plurality of first electrodes P11P to P18P are provided on a first mounting surface MS1 of the stacked body 10F, and the plurality of second electrodes P21P to P28P are provided on a second mounting surface MS2 of the stacked body 10F.

As mainly shown in FIG. 17B and FIG. 18, linear conductors 21, 22, 23, 24, 25, 26, 27, and 28 are provided inside (on a surface of an insulating layer 12*f*) of the stacked body 10F. The stacked body 10F includes a plurality of insulating layers 11*f* and 12*f* that are stacked on each other. The insulating layer 11*f* is preferably, for example, a solder resist film, a coverlay film, or the like. The insulating layer 12*f* is preferably a sheet made of a thermoplastic resin such as a liquid crystal polymer (LCP), for example. The conductors 21 to 28 are preferably conductor patterns such as a Cu foil, for example.

The insulating layer 11f is an insulating film provided on the entire or substantially the entire surface on the insulating layer 12f and covering the conductors 21 to 28. The insulating layer 11f includes an opening at positions corresponding to a plurality of electrodes (the plurality of first electrodes P11P to P18P and the plurality of second electrode P21P to P28P). Therefore, the insulating layer 11f is provided on the insulating layer 12f, which causes portions of the conductors 21 to 28 to be exposed from a surface of the stacked body 10F.

As shown in FIG. 18, in the fifth preferred embodiment, the portions of the conductor 21 exposed on the surface of the stacked body 10F are the first electrode P11P and the second electrode P21P. In addition, the portions of the conductor 22 exposed on the surface of the stacked body 10F are the first electrode P12P and the second electrode P22P. The portions of the conductor 23 exposed on the surface of the stacked body 10F are the first electrode P13P and the second electrode P23P. The portions of the conductor 24 exposed on the surface of the stacked body 10F are the first electrode P14P and the second electrode P24P. The portions of the conductor 25 exposed on the surface of the stacked body 10F are the first electrode P15P and the second electrode P25P. The portions of the conductor 26 exposed on the surface of the stacked body 10F are the first electrode P16P and the second electrode P26P. The portions of the conductor 27 exposed on the surface of the stacked body 10F are the first electrode P17P and the second electrode P27P. The portions of the conductor 28 exposed on the surface of the stacked body 10F are the first electrode P18P and the second electrode P28P.

In this manner, the first electrode P11P and the second electrode P21P are electrically connected to each other. The first electrode P12P and the second electrode P22P are electrically connected to each other. The first electrode P13P and the second electrode P23P are electrically connected to each other. The first electrode P14P and the second electrode P24P are electrically connected to each other. The first electrode P15P and the second electrode P25P are electrically connected to each other. The first electrode P16P and the second electrode P26P are electrically connected to each other. The first electrode P17P and the second electrode P27P are electrically connected to each other. The first electrode P18P and the second electrode P28P are electrically connected to each other.

In addition, the stacked body 10F, as shown in FIG. 17A, includes bent portions CR1, CR2, CR3, and CR4 that are bent in a plan view (viewed in a Z axis direction) of the first mounting surface MS1 and the second mounting surface MS2.

According to the electronic device 405 of the fifth preferred embodiment of the present invention, the following advantageous effects in addition to the advantageous effects described in the first preferred embodiment are obtained.

(r) In the fifth preferred embodiment, the stacked body 10F before being folded includes portions (the side FS11 and the side FS12, the side FS21 and the side FS22, the side FS31 and the side FS32, and the side FS41 and the side FS42 that are shown in FIG. 18) provided in a portion of the outer shape, the portions being brought into close contact with each other when the stacked body 10F is folded. With this configuration, the rigidity of the folded stacked body 10F as a whole is able to be increased, which enables the stacked body 10F to be difficult to deform even when external forces are applied to the folded stacked body 10F. Therefore, after the first element and the second element are connected by the interposer 305, the positional relationship between the first element and the second element, the positional relationship between the first element and the interposer 305, or the positional relationship between the second element and the interposer 305 is able to be maintained with high accuracy.

Sixth Preferred Embodiment

A sixth preferred embodiment of the present invention provides an example of a stacked body including a connection portion.

Figure 19:
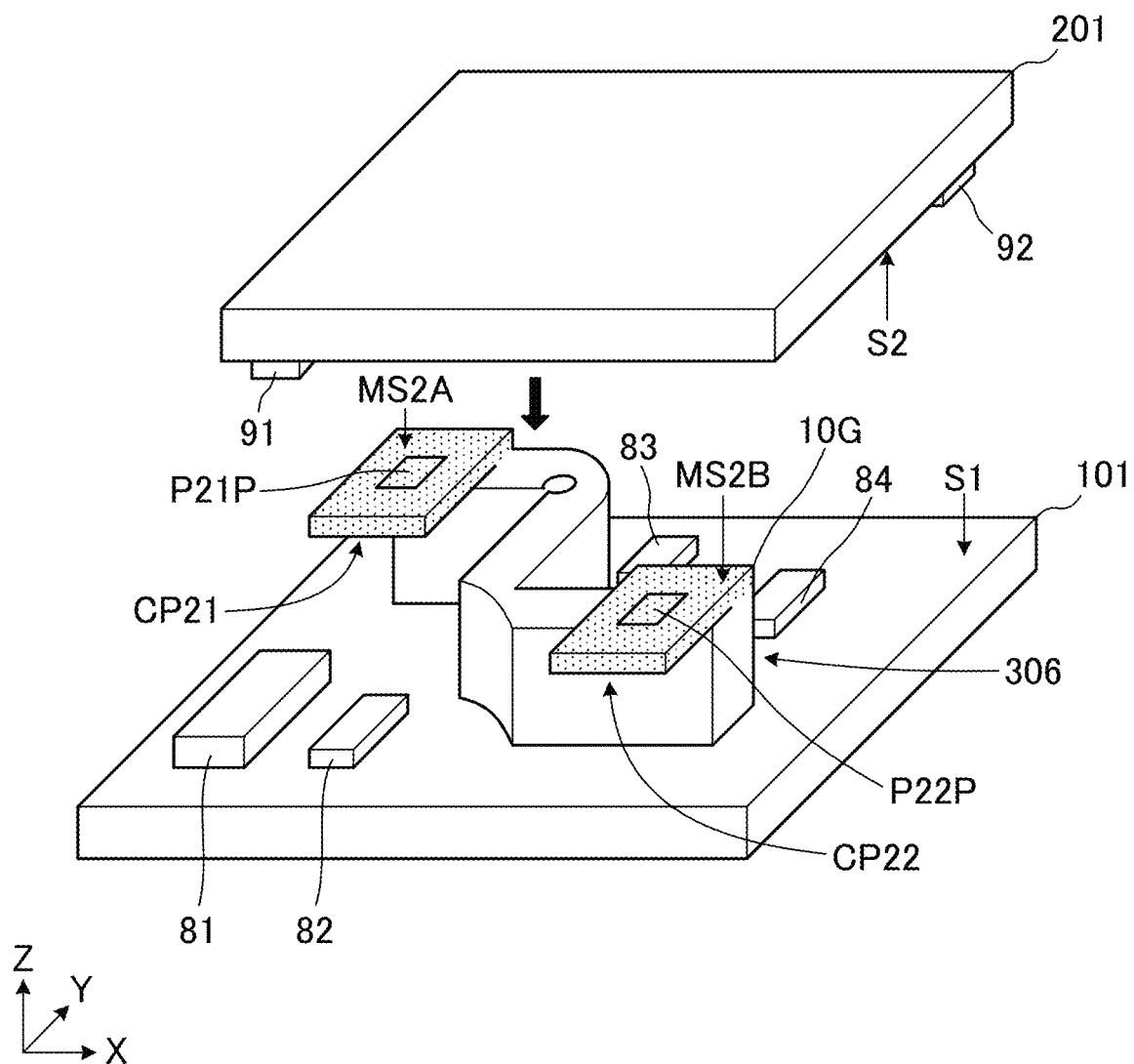
FIG. 19 is an external perspective view showing a main portion of an electronic device 406 according to a sixth preferred embodiment of the present invention.
Figure 20:
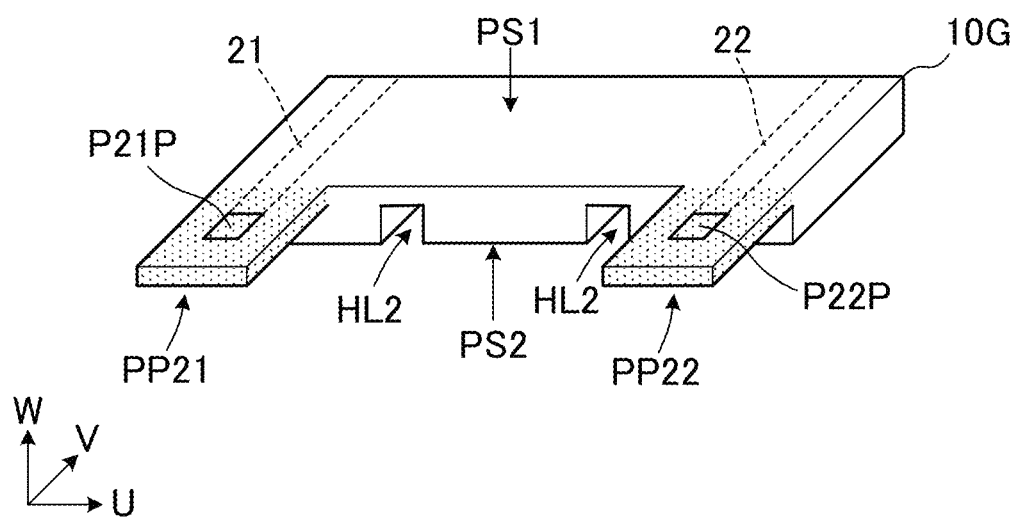
FIG. 20 is an external perspective view showing a state before an interposer 306 according to the sixth preferred embodiment is folded.

FIG. 19 is an external perspective view showing a main portion of an electronic device 406 according to the sixth preferred embodiment of the present invention. FIG. 20 is an external perspective view showing a state before an interposer 306 according to the sixth preferred embodiment is folded. In FIG. 19, in order to make the structure more understandable, connection portions CP21 and CP22 are indicated by dot hatching. In addition, in FIG. 20, projecting portions PP21 and PP22 are indicated by dot hatching.

The electronic device 406 is different from the electronic device 401 according to the first preferred embodiment in that the electronic device 406 includes an interposer 306. In addition, the interposer 306 is different from the interposer 301 according to the first preferred embodiment in that the interposer 306 includes a stacked body 10G folded into a crank shape or a substantially crank shape. Other configurations of the electronic device 406 are the same as or similar to the configurations of the electronic device 401.

Hereinafter, differences from the electronic device 401 according to the first preferred embodiment of the present invention will be described.

The interposer 306 includes a stacked body 10G, a plurality of first electrodes (not shown), and a plurality of second electrodes P21P and P22P.

The stacked body 10G is obtained, for example, by folding the stacked body 10G (a substantially U-shaped plate of which the long-side direction coincides with a U axis direction) shown in FIG. 20, into a crank shape.

The stacked body 10G includes a plurality of concave portions HL2 provided in a portion to be folded. The concave portion HL2 is provided on a bottom surface PS2 of the stacked body 10G shown in FIG. 20 and extends in a short-side direction (the V axis direction). The concave portions HL2 include the smaller number of stacked insulating layers than other portions. Therefore, the portions including the concave portions HL2 are folded more easily than the other portions.

In addition, the stacked body 10G includes connection portions CP21 and CP22 of which the plane shape is rectangular or substantially rectangular. The connection portions CP21 and CP22 are connected to the second circuit board 201 of the interposer 306. The connection portion CP21 includes a second mounting surface MS2A, and the connection portion CP22 includes a second mounting surface MS2B.

The connection portions CP21 and CP22 according to the sixth preferred embodiment are examples of a "second connection portion".

The connection portion CP21 is provided by folding the projecting portion PP21 of the stacked body 10G shown in FIG. 20. The connection portion CP22 is provided by folding the projecting portion PP22 of the stacked body 10G shown in FIG. 20.

The plurality of first electrodes (not shown) are provided on a first mounting surface MS1 of the stacked body 10G. The second electrode P21P is provided on a second mounting surface MS2A of the connection portion CP21, and the second electrode P22P is provided on a second mounting surface MS2B of the connection portion CP22. As will be described in detail later, the second electrodes P21P and P22P are conductor patterns provided on a surface of an insulating layer.

As shown in FIG. 20, linear conductors 21 and 22 are provided inside (on a surface of an insulating layer) of the stacked body 10G. The plurality of first electrodes are end surfaces (end portions) of the conductors 21 and 22 each of which is exposed to the first mounting surface MS1. In addition, in the sixth preferred embodiment, a portion of the conductor 21 exposed on a surface (a top surface PS1) of the stacked body 10G is the second electrode P21P. A portion of the conductor 22 exposed on the surface of the stacked body 10G is the second electrode P22P.

As shown in FIG. 19, the interposer 306 is mounted on an upper surface S1 of the first circuit board 101 including a plurality of components 81, 82, 83, and 84, and components 91 and 92 are mounted on a lower surface S2 of the second circuit board 201. The first mounting surface MS1 of the stacked body 10G faces the upper surface S1 of the first circuit board 101. The second mounting surface MS2A of the connection portion CP21 and the second mounting surface MS2B of the connection portion CP22 face the lower surface S2 of the second circuit board 201.

The plurality of first electrodes (not shown) of the interposer 306 are respectively directly soldered to a plurality of first lands (not shown) provided on the upper surface S1 of the first circuit board 101. Accordingly, the interposer 306 and the first circuit board 101 are electrically connected to each other.

The second electrode P21P provided in the connection portion CP21 and the second electrode P22P provided in the connection portion CP22 are respectively directly soldered to a plurality of second lands (not shown) provided on the lower surface S2 of the second circuit board 201. Accordingly, the interposer 306 and the second circuit board 201 are electrically connected to each other.

Figure 21:
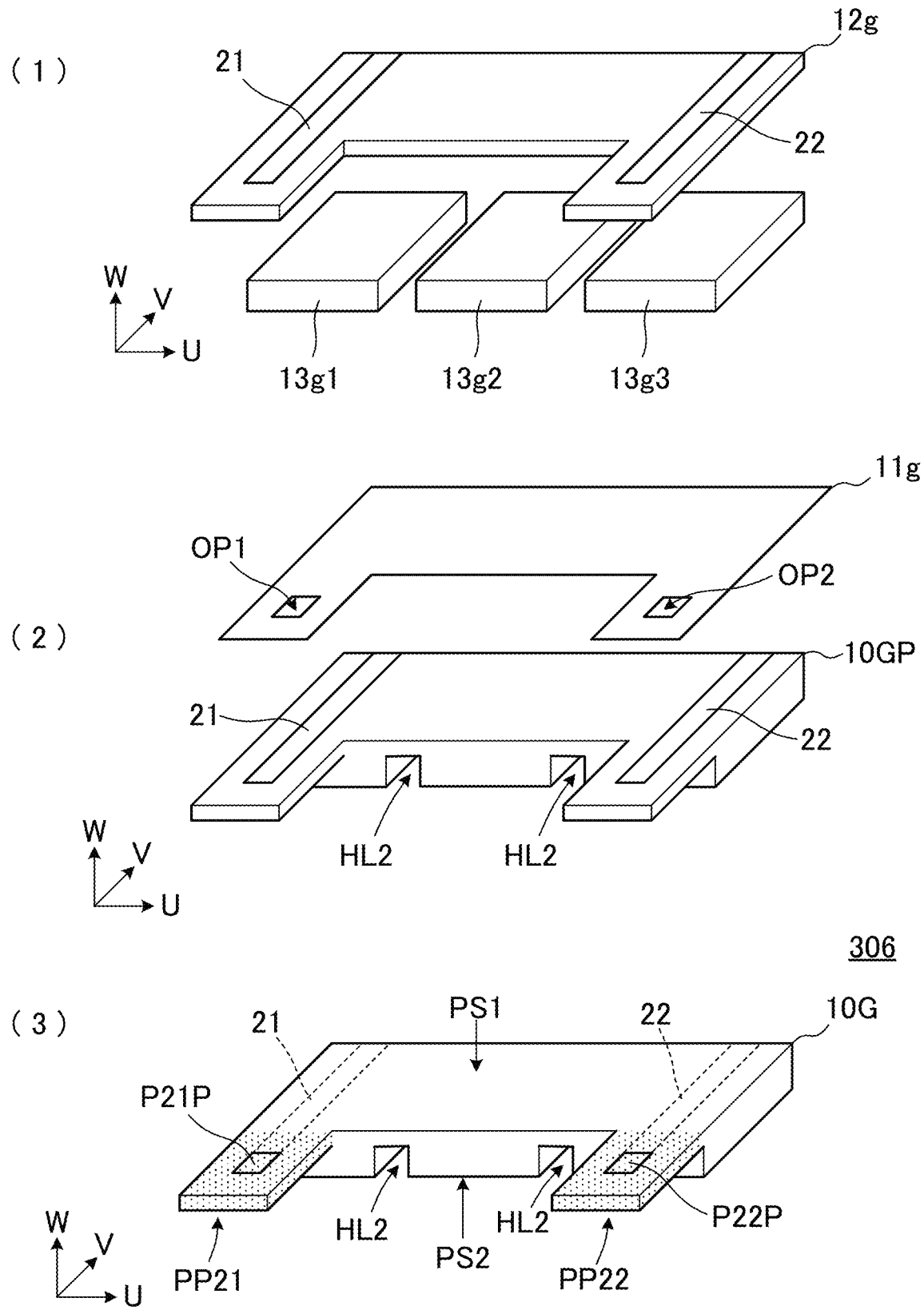
FIG. 21 is a perspective view sequentially showing steps of manufacturing the interposer 306 before being folded.

The interposer 306 according to the sixth preferred embodiment is preferably manufactured by, for example, the following steps. FIG. 21 is a perspective view sequentially showing steps of manufacturing the interposer 306 before being folded.

First, as shown in step (1) in FIG. 21, a plurality of insulating layers 12g, 13g1, 13g2, and 13g3 having flexibility are prepared. The insulating layer 12g is a U-shaped resin plate. The insulating layers 13g1 to 13g3 are rectangular or substantially rectangular resin plates having a substantially same shape. The insulating layers 13g1 to 13g3 are shorter in the long-side direction (the U axis direction) than the insulating layer 12g. The plurality of insulating layers 12g, and 13g1 to 13g3 are preferably sheets made of a thermoplastic resin such as a liquid crystal polymer (LCP), for example.

Subsequently, conductors 21 and 22 are provided on a surface of the insulating layer 12g. Specifically, a metal foil (a Cu foil, for example) is laminated on one (a front surface) of the principal surfaces of the insulating layer 12g in a collective substrate state, and the metal foil is patterned by photolithography, for example. As a result, the conductors 21 and 22 are provided on the surface of the insulating layer 12g.

Subsequently, the plurality of insulating layers 12g and 13g1 to 13g3 are stacked on each other. The insulating layers 13g1, 13g2, and 13g3 are disposed in this order in the positive U direction.

When the plurality of insulating layers are stacked, the insulating layers 13g1 and 12g are stacked in this order. The insulating layers 13g2 and 12g are stacked in this order. The insulating layers 13g3 and 12g are stacked in this order.

Subsequently, as shown in step (2) in FIG. 21, the stacked insulating layers 12g and 13g1 to 13g3 are heated and pressed to provide a stacked body 10GP.

When the stacked body is provided, a portion (a portion including the smaller number of stacked insulating layers) in which the insulating layers 13g1 to 13g3 are not stacked underneath the insulating layer 12g includes a concave portion HL2 due to a difference in the number of stacked insulating layers. The concave portion HL2 includes the smaller number of stacked insulating layers than other portions. Therefore, the portion including the concave portion HL2 is folded more easily than the other portions.

Subsequently, the insulating layer 11g is stacked (provided) on the stacked body 10GP to provide a stacked body 10G shown in step (3) in FIG. 21. The insulating layer 11g is an insulating film provided on the entire or substantially the entire surface of the stacked body 10GP (the insulating layer 12g) and covering the conductors 21 and 22. The insulating layer 11g includes openings OP1 and OP2 at positions corresponding to the second electrodes. Therefore, the insulating layer 11g is provided on the stacked body 10GP, which causes a portion of the conductors 21 and 22 to be exposed from a top surface of the stacked body 10G. The insulating layer 11g is preferably, for example, a solder resist film, a coverlay film, or the like.

The second electrode P21P is a portion of the conductor 21 exposed on the top surface PS1 of the stacked body 10G. The second electrode P22P is a portion of the conductor 22 exposed on the top surface PS1 of the stacked body 10G.

Finally, the stacked body in a collective substrate state is divided to obtain an individual interposer 306 (a rectangular or substantially rectangular parallelepiped-shaped stacked body 10G).

It is to be noted that, while the sixth preferred embodiment of the present invention provides an example in which the stacked body includes only the second connection portion (the connection portions CP21 and CP22) including a second mounting surface, the present invention is not limited to such a configuration. The stacked body may include only a connection portion (the first connection portion) including the first mounting surface. The stacked body may include both the connection portion (the first connection portion) including the first mounting surface and the connection portion (the second connection portion) including the second mounting surface.

In addition, while the sixth preferred embodiment of the present invention provides an example in which the stacked body 10G includes the two second connection portions (the connection portions CP21 and CP22) of which the plane shape is rectangular or substantially rectangular, the present invention is not limited to such a configuration. The number and shape of the connection portions (the first connection portion and the second connection portion) may be appropriately changed as long as the advantageous effects of the present invention are obtained.

Other Preferred Embodiments

It is to be noted that the shape of the folded stacked body is not limited to the shape as described in each of the above preferred embodiments and may be appropriately changed as long as the advantageous effects of the present invention are obtained. In addition, the way of folding the stacked body is not limited to the ways described in each of the above preferred embodiments and may be appropriately changed as long as the advantageous effects of the present invention are obtained.

While each of the above preferred embodiments provides an example of the stacked body including two or three insulating layers that are stacked on each other, the present invention is not limited to such a configuration. The number of stacked insulating layers defining the stacked body may be appropriately changed as long as the advantageous effects of the present invention are obtained, and may be four or more, for example.

While each of the above preferred embodiments provides an example in which the entire or substantially the entire interposer is disposed (interposed) between the first element (the first circuit board 101) and the second element (the second circuit board 201), the present invention is not limited to such a configuration. A portion of the interposer may be disposed between the first element and the second element.

While each of the above preferred embodiments provides an example in which the stacked body is provided by stacking two or more insulating layers made of a thermoplastic resin (a liquid crystal polymer) and an example in which the stacked body is provided by stacking the insulating layer such as a coverlay film on the insulating layer made of a thermoplastic resin, the present invention is not limited to such configurations. Each insulating layer may preferably include a thermoplastic resin such as a polyimide (PI) or a polyether ether ketone (PEEK), for example. In addition, the stacked body is not limited to a stacked body of which the surfaces are fused by heating and pressing the stacked insulating layers, and may include an adhesive layer between respective insulating layers. Furthermore, the insulating layers may be made of a thermosetting resin such as an epoxy resin. Moreover, a stacked body may be obtained by heating and pressing a body stacked with a bonding layer (a semi-hardened prepreg resin, for example) interposed between the plurality of insulating layers made of a thermosetting resin.

Furthermore, the stacked body of the interposer may include a composite of a plurality of resin materials. For example, the stacked body may be provided by stacking a thermosetting resin such as a glass epoxy substrate, and a thermoplastic resin.

While each of the above preferred embodiments provides an example in which the interposer includes only the electrodes (the first electrode and the second electrode) that electrically connects the first element (the first circuit board 101) and the second element (the second circuit board 201), the present invention is not limited to such a configuration. For example, the interposer may include an auxiliary electrode (an electrode that does not electrically connect the first element and the second elements). With a configuration including an auxiliary electrode, even when an interposer has an elongated shape, such an interposer as well as other components are able to be solder-mounted on the first element or the second element.

It is to be noted that, while each of the above preferred embodiments provides an example in which the interposer and the second element (the second circuit board 201) are directly connected through solder, the interposer and the second circuit board 201 may be connected through a connector. For example, a plug may be mounted on the second mounting surface MS2 of the interposer, a receptacle may be mounted on the lower surface S2 of the second circuit board 201, and the interposer and the second circuit board 201 may be electrically and mechanically connected to each other by fitting of the plug and the receptacle.

In addition, various components such as chip components may be embedded in the interposer of the present invention.

Moreover, while each of the above preferred embodiments provides an example of the interposer including only a signal line, the present invention is not limited to such a configuration. For example, the interposer may include a conductor pattern such as an inductor or a capacitor in addition to the signal line. Further, the interposer may include a frequency filter such as various filters (a low pass filter, a high pass filter, a band pass filter, or a band elimination filter).

The circuit configuration provided on the interposer (the stacked body) is not limited to the configuration described in each of the preferred embodiments. The circuit provided on the interposer may be appropriately changed as long as the advantageous effects of the present invention are obtained. For example, the interposer may include a coil defined by conductor patterns or a capacitor defined by conductor patterns. In addition, the interposer may include various types of transmission lines (such as a strip line, a microstrip line, and a coplanar line), for example. Moreover, for example, the stacked body may include a chip component such as a chip inductor or a chip capacitor.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An interposer comprising:
   a stacked body including:
      a first mounting surface and a second mounting surface that face each other;
      a plurality of insulating layers having flexibility and being stacked on each other; and
      a folded portion;
   a first electrode on the first mounting surface; and
   a second electrode on the second mounting surface and being electrically connected to the first electrode;
   a stacking direction in which the plurality of insulating layers are stacked is parallel or substantially parallel to the first mounting surface and the second mounting surface; and
      the folded portion is folded a plan view of the first mounting surface and the second mounting surface.

2. The interposer according to claim 1, wherein the stacked body includes a cutout portion in the folded portion.

3. The interposer according to claim 1, wherein
   the stacked body includes a concave portion in the folded portion; and
   the concave portion includes a smaller number of stacked insulating layers than other portions of the stacked body.

4. The interposer according to claim 1, wherein
   the stacked body includes a first connection portion including the first mounting surface; and
   the first electrode is a conductor pattern provided on the first mounting surface of the first connection portion and provided on a surface of the plurality of insulating layers.

5. The interposer according to claim 1, wherein
   the stacked body includes a second connection portion including the second mounting surface; and the second electrode is a conductor pattern provided on the second mounting surface of the second connection portion and provided on a surface of the plurality of insulating layers.

6. The interposer according to claim 1, wherein two or more insulating layers that are adjacent to each other among the plurality of insulating layers are made of a thermoplastic resin.

7. The interposer according to claim 1, further comprising:
   a conductor disposed inside the stacked body; wherein
   the first electrode is defined by a first end surface of the conductor; and
   the second electrode is defined by a second end surface of the conductor.

8. The interposer according to claim 1, wherein the folded portion is L-shaped.

9. The interposer according to claim 1, further comprising:
   a plurality of first ground electrodes provided on the first mounting surface; and
   a plurality of second ground electrode provided on the second mounting surface; wherein
   the first electrode is interposed between the plurality of first ground electrodes on the first mounting surface; and
   the second electrode is interposed between the plurality of second ground electrodes on the second mounting surface.

10. The interposer according to claim 1, wherein the stacked body is ring-shaped.

11. The interposer according to claim 1, wherein the first mounting surface and the second mounting surface are defined by outer edges of the plurality of the insulator layers.

12. An electronic device comprising:
   a first element;
   a second element; and
   an interposer that electrically connects the first element and the second element; wherein
   the interposer includes:
      a stacked body including:
      a first mounting surface and a second mounting surface that face each other;
      a plurality of insulating layers having flexibility and being stacked on each other; and
      a folded portion;
   a first electrode on the first mounting surface; and
   a second electrode on the second mounting surface and being electrically connected to the first electrode;
      a stacking direction in which the plurality of insulating layers are stacked is parallel or substantially parallel to the first mounting surface and the second mounting surface; and
      the folded portion is folded a plan view of the first mounting surface and the second mounting surface;
   the first electrode is electrically connected to the first element; and
   the second electrode is electrically connected to the second element.

13. The electronic device according to claim 12, wherein the stacked body includes a cutout portion in the folded portion.

14. The electronic device according to claim 12, wherein
   the stacked body includes a concave portion in the folded portion; and
   the concave portion includes a smaller number of stacked insulating layers than other portions of the stacked body.

15. The electronic device according to claim 12, wherein
   the stacked body includes a first connection portion including the first mounting surface; and
   the first electrode is a conductor pattern provided on the first mounting surface of the first connection portion and provided on a surface of the plurality of insulating layers.

16. The electronic device according to claim 12, wherein
   the stacked body includes a second connection portion including the second mounting surface; and
   the second electrode is a conductor pattern provided on the second mounting surface of the second connection portion and provided on a surface of the plurality of insulating layers.

17. The electronic device according to claim 12, wherein two or more insulating layers that are adjacent to each other among the plurality of insulating layers are made of a thermoplastic resin.

18. The electronic device according to claim 12, further comprising:
   a conductor disposed inside the stacked body; wherein
   the first electrode is defined by a first end surface of the conductor; and
   the second electrode is defined by a second end surface of the conductor.

19. The electronic device according to claim 12, wherein the folded portion is L-shaped.

20. The electronic device according to claim 12, further comprising:
   a plurality of first ground electrodes provided on the first mounting surface; and
   a plurality of second ground electrode provided on the second mounting surface; wherein
   the first electrode is interposed between the plurality of first ground electrodes on the first mounting surface; and
   the second electrode is interposed between the plurality of second ground electrodes on the second mounting surface.

21. The electronic device according to claim 12, wherein the stacked body is ring-shaped.

22. The electronic device according to claim 12, wherein the first mounting surface and the second mounting surface are defined by outer edges of the plurality of the insulator layers.

* * * * *